US010659022B2

(12) United States Patent
Sakakibara

(10) Patent No.: US 10,659,022 B2
(45) Date of Patent: May 19, 2020

(54) COMPARATOR, ANALOG-TO-DIGITAL CONVERTER, SOLID-STATE IMAGE PICKUP DEVICE, AND IMAGE PICKUP APPARATUS

(71) Applicant: SONY CORPORATION, Tokyo (JP)

(72) Inventor: Masaki Sakakibara, Kanagawa (JP)

(73) Assignee: Sony Corporation, Toyko (JP)

( * ) Notice: Subject to any disclaimer, the term of this patent is extended or adjusted under 35 U.S.C. 154(b) by 7 days.

(21) Appl. No.: 16/065,848

(22) PCT Filed: Nov. 30, 2016

(86) PCT No.: PCT/JP2016/085577
§ 371 (c)(1),
(2) Date: Jun. 25, 2018

(87) PCT Pub. No.: WO2017/119220
PCT Pub. Date: Jul. 13, 2017

(65) Prior Publication Data
US 2019/0013799 A1    Jan. 10, 2019

(30) Foreign Application Priority Data

Jan. 7, 2016  (JP) ................................. 2016-001987

(51) Int. Cl.
*H03K 5/08*  (2006.01)
*H03M 1/56*  (2006.01)
(Continued)

(52) U.S. Cl.
CPC ............. *H03K 5/08* (2013.01); *H03K 5/2481* (2013.01); *H03M 1/56* (2013.01); *H04N 5/374* (2013.01);
(Continued)

(58) Field of Classification Search
CPC .... H03K 5/08; H03K 5/2481; H04N 5/37455; H04N 5/374; H04N 5/378; H03M 1/56
(Continued)

(56) References Cited

U.S. PATENT DOCUMENTS 6,788,237 B1 *  9/2004  Bidermann ........... H03M 1/123
341/155
8,976,284 B2     3/2015  Tanaka
(Continued)

FOREIGN PATENT DOCUMENTS

| EP | 1017231 | 7/2000 |
|---|---|---|
| JP | 2001-223566 | 8/2001 |

(Continued)

OTHER PUBLICATIONS

International Search Report prepared by the Japan Patent Office dated Feb. 7, 2017, for International Application No. PCT/JP2016/085577.
(Continued)

*Primary Examiner* — Khai M Nguyen
(74) *Attorney, Agent, or Firm* — Sheridan Ross P.C.

(57) ABSTRACT

In a comparator of an analog-to-digital converter, an input signal is input to a control terminal of each of a plurality of signal input transistors. A signal input transistor selection section selects any one of the plurality of signal input transistors, and generates a current in response to a difference between the input signal and a reference signal to flow in the differential pair configured with the selected signal input transistor and a reference input transistor. A load section converts, at a time of a change of a current flowing in any one of the plurality of signal input transistors and the reference input transistor in response to the difference, the change of the current into a change of a voltage, and outputs
(Continued)

the change of the voltage as a result of comparison between the input signal and the reference signal.

8 Claims, 22 Drawing Sheets

(51) Int. Cl.
*H04N 5/378* (2011.01)
*H04N 5/374* (2011.01)
*H03K 5/24* (2006.01)
*H04N 5/3745* (2011.01)

(52) U.S. Cl.
CPC ......... *H04N 5/378* (2013.01); *H04N 5/37455* (2013.01)

(58) Field of Classification Search
USPC ..................................... 341/155; 327/65–67
See application file for complete search history.

(56) References Cited

U.S. PATENT DOCUMENTS

| 2001/0020909 | A1* | 9/2001 | Sakuragi | H03M 1/1225 |
| | | | | 341/139 |
| 2006/0250165 | A1* | 11/2006 | Carey | H03K 5/2418 |
| | | | | 327/65 |
| 2006/0284999 | A1 | 12/2006 | Muramatsu et al. | |
| 2008/0150636 | A1 | 6/2008 | Wu | |
| 2008/0291310 | A1 | 11/2008 | Ladd et al. | |
| 2009/0160990 | A1 | 6/2009 | Johnson | |

FOREIGN PATENT DOCUMENTS

| JP | 2006-340044 | 12/2006 |
| JP | 2013-162493 | 8/2013 |

OTHER PUBLICATIONS

Yang et al., "A Nyquist-Rate Pixel-Level ADC for CMOS Image Sensors," IEEE Journal of Solid-State Circuits, vol. 34, No. 3, Mar. 1999, pp. 348-356.

Extended European Search Report for European Patent Application No. 16883720.1, dated Nov. 23, 2018, 16 pages.

* cited by examiner

F I G . 7
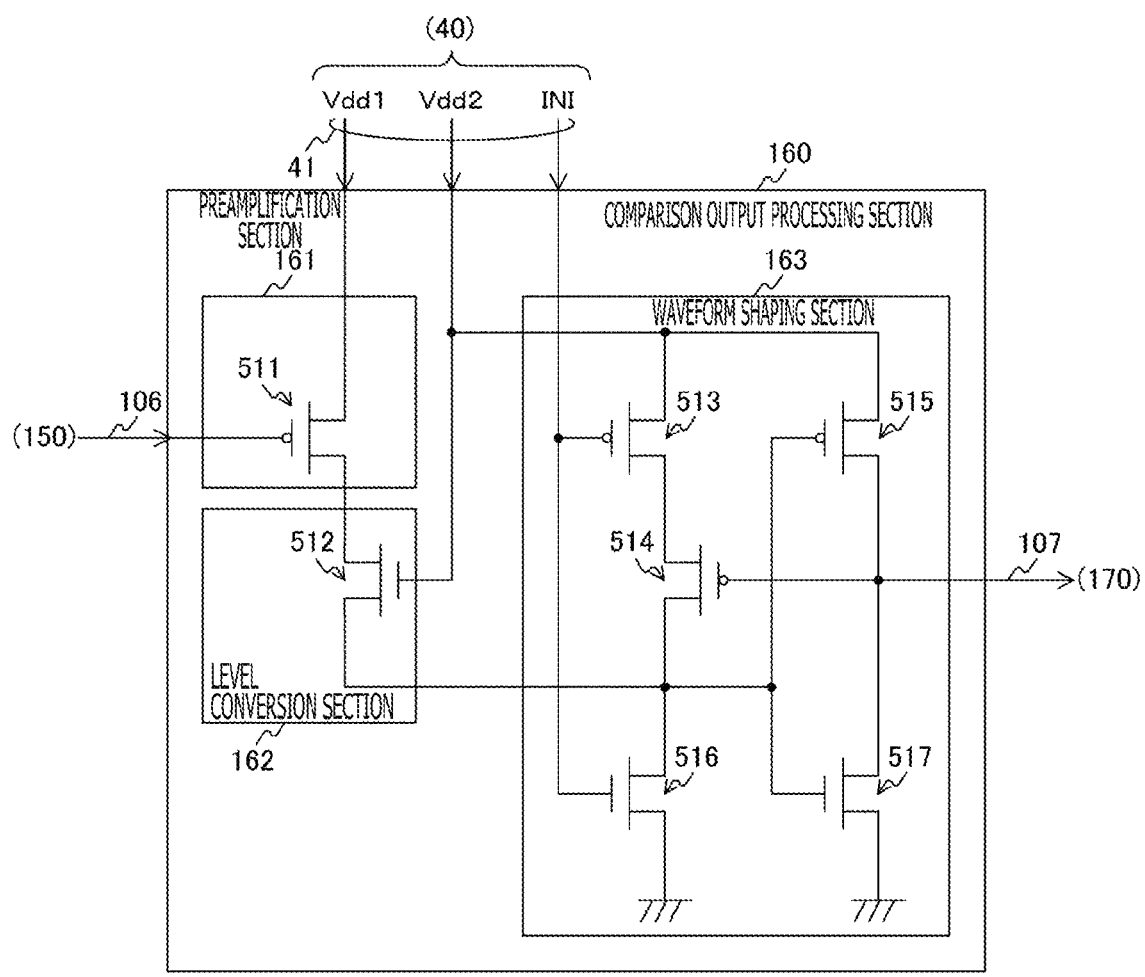

F I G . 1 6
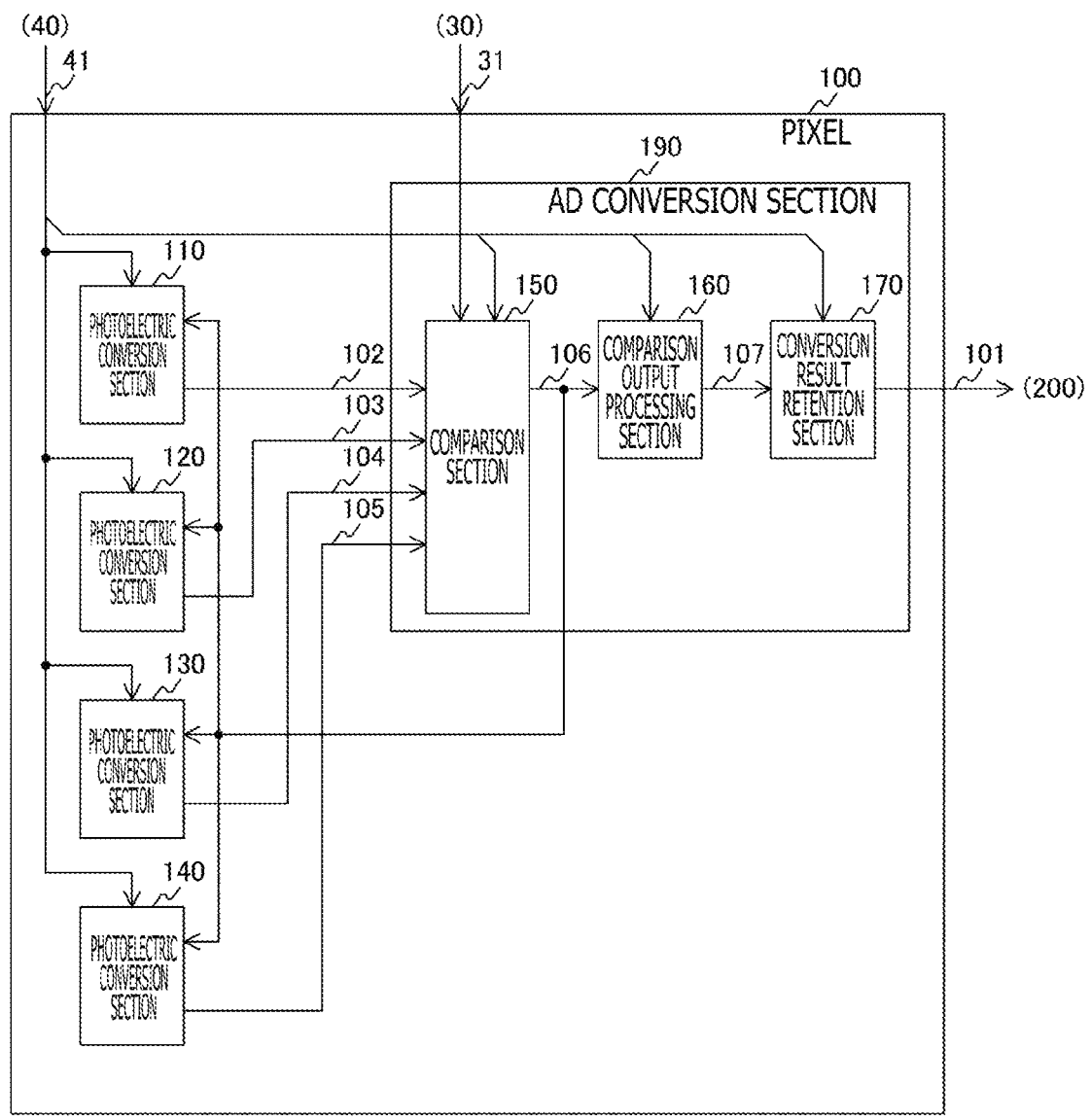

FIG.21
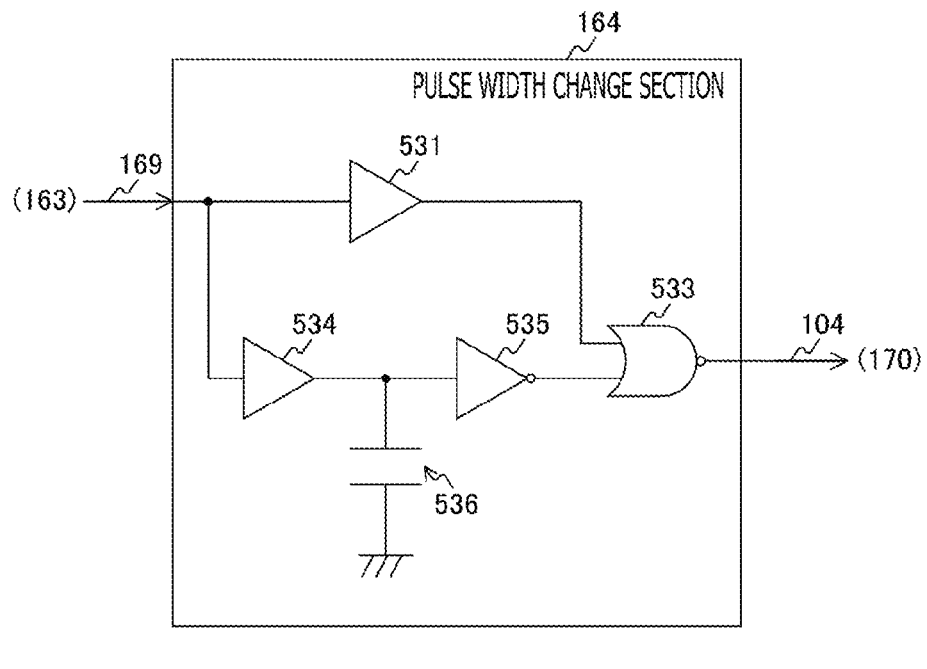
a
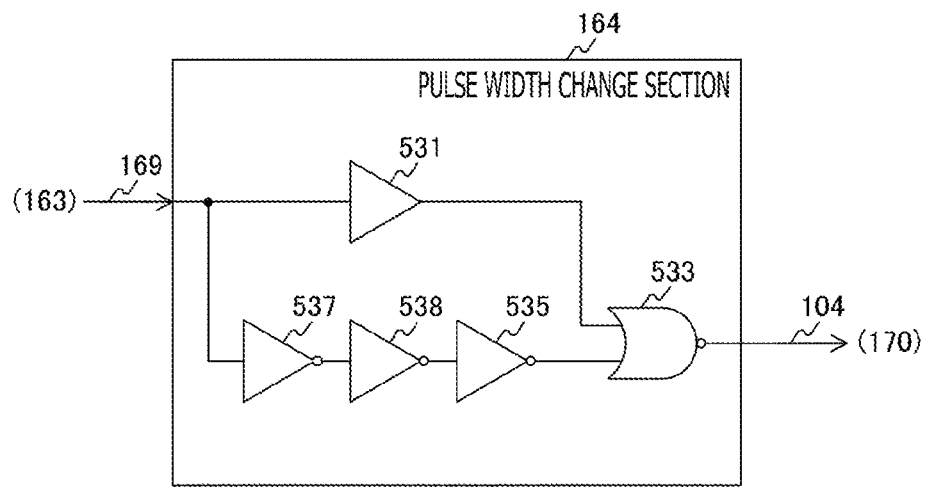
b

COMPARATOR, ANALOG-TO-DIGITAL CONVERTER, SOLID-STATE IMAGE PICKUP DEVICE, AND IMAGE PICKUP APPARATUS

CROSS REFERENCE TO RELATED APPLICATIONS

This application is a national stage application under 35 U.S.C. 371 and claims the benefit of PCT Application No. PCT/JP2016/085577 having an international filing date of 30 Nov. 2016, which designated the United States, which PCT application claimed the benefit of Japanese Patent Application No. 2016-001987 filed 7 Jan. 2016, the entire disclosures of each of which are incorporated herein by reference.

TECHNICAL FIELD

The present technique relates to a comparator, an analog-to-digital converter, a solid-state image pickup device, and an image pickup apparatus. More specifically, the present technique relates to a comparator to which a plurality of signals are input, and an analog-to-digital converter, a solid-state image pickup device, and an image pickup apparatus each having this comparator.

BACKGROUND ART

There has been used an image pickup apparatus configured such that in an image pickup device in which pixels are arranged in a two-dimensional matrix, image signals are output from the pixels in every row at a time, the image signals corresponding to one row are sequentially subjected to analog-to-digital conversion, and resultant signals are output as digital image signals in the past. To meet a recent demand of speedup of image signal output, there have been proposed systems for speeding up analog-to-digital conversion by arranging an analog-to-digital converter in each pixel and simultaneously performing analog-to-digital conversion in all pixels. For example, there is proposed a system configured such that an analog-to-digital converter having a comparison section that compares an analog image signal generated by a photodiode with a reference signal and a latch that retains a digital signal generated on the basis of a comparison result is arranged in each pixel. The reference signal means herein a signal at a voltage changing in a ramp state and a signal commonly input to the analog-to-digital converters corresponding to all the pixels arranged in the image pickup apparatus. In the system, the comparison section compares the analog image signal with the reference signal. In addition, when the voltage of the reference signal transitions from a lower state than a voltage of the analog image signal to a higher state or from the higher state to the lower state, the comparison section detects a change of this voltage and outputs the change of the voltage as the comparison result. Furthermore, a codeword that is a digital signal corresponding to the voltage of the reference signal is input to the latch, and the input codeword is retained in the latch on the basis of a detection result of the comparison section. Subsequently, the codeword retained in the latch is output as a result of analog-to-digital conversion (refer to, for example, NPL 1).

CITATION LIST

Non Patent Literature

[NPL]
D. Yang, B. Fowler, and A. El Gamal, "A Nyquist Rate Pixel Level ADC for CMOS Image Sensors," Proc. of IEEE 1998 Custom Integrated Circuits Conf., Santa Clara, Calif., May 1998, pp. 237 to 240 (1998).

SUMMARY

Technical Problem

In a case of applying the above existing technique to a pixel having a plurality of photodiodes, it is necessary to arrange the analog-to-digital converter per photodiode; thus, the existing technique has a problem of complicating a configuration of the pixel.

The present technique has been produced in the light of such circumstances and an object of the present technique is to simplify a pixel configuration by using an analog-to-digital converter that has a comparison section to which a plurality of signals can be input so that the analog-to-digital converter can be commonly used in each pixel having a plurality of photodiodes.

Solution to Problem

The present technique has been achieved to solve the problems. According to a first aspect of the present technique, there is provided a comparator including: a plurality of signal input transistors each having a control terminal to which an input signal is input; a reference input transistor configuring, together with each of the plurality of signal input transistors, a differential pair, and having a control terminal to which a reference signal is input; a signal input transistor selection section selecting any one of the plurality of signal input transistors, and generating a current in response to a difference between the input signal and the reference signal to flow in the differential pair configured with the selected signal input transistor and the reference input transistor; and a load section converting, at a time of a change of a current flowing in any one of the plurality of signal input transistors and the reference input transistor in response to the difference, the change of the current into a change of a voltage, and outputting the change of the voltage as a result of comparison between the input signal and the reference signal. This produces a function of selecting any one of the plurality of signal input transistors and comparing the input signal of this selected signal input transistor with the reference signal.

Furthermore, according to this first aspect, the signal input transistor selection section may select the one signal input transistor by applying, to the control terminals of unselected signal input transistors among the plurality of signal input transistors, a voltage for turning the unselected signal input transistors into a non-conductive state. This produces a function of turning the unselected signal input transistors into a non-conductive state.

Moreover, according to this first aspect, the signal input transistor selection section may select the one signal input transistor by interrupting a current flowing in unselected signal input transistors among the plurality of signal input transistors. This produces a function of interrupting the current flowing in the unselected signal input transistors.

Furthermore, according to this first aspect, the load section may be configured with a current source that supplies a current to the plurality of signal input transistors. This produces a function of converting the change of the current into the change of the voltage by the current source.

Moreover, according to this first aspect, the load section may be configured with a current mirror circuit that supplies, to the plurality of signal input transistors, a current substantially equal to a current flowing in the reference input transistor. This produces a function of configuring the load section with the current mirror circuit.

Furthermore, according to this first aspect, the comparator may include: a plurality of signal input transistors each having a control terminal to which an input signal is input; a plurality of reference input transistors configuring, together with the plurality of signal input transistors, individual differential pairs, and each having a control terminal to which a reference signal is input; a signal input transistor selection section selecting any one of the plurality of signal input transistors, and generating a current in response to a difference between the input signal and the reference signal to flow in the differential pair configured with the selected signal input transistor and one of the plurality of reference input transistors; and a load section converting, at a time of a change of a current flowing in any one of the plurality of signal input transistors and the plurality of reference input transistors in response to the difference, the change of the current into a change of a voltage, and outputting the change of the voltage as a result of comparison between the input signal and the reference signal. This produces a function of selecting any one of the plurality of differential pairs and comparing the input signal with the reference signal in this selected differential pair.

Moreover, according to this first aspect, the signal input transistor selection section may select the one signal input transistor by interrupting a current flowing in the differential pairs including unselected signal input transistors among the plurality of signal input transistors. This produces a function of interrupting the current flowing in the differential pairs including the unselected signal input transistors.

Furthermore, according to this first aspect, the signal input transistor selection section may be configured with a plurality of constant current power supplies that are connected to the plurality of differential pairs and that control a current flowing in each of the differential pairs and the signal input transistor selection section may interrupt the current flowing in the differential pairs including the unselected signal input transistors by the constant current power supplies. This produces a function of interrupting the current flowing in the differential pairs including the unselected signal input transistors by the constant current power supplies.

Moreover, according to a second aspect, there is provided an analog-to-digital converter including: a plurality of signal input transistors each having a control terminal to which an input signal is input; a reference input transistor configuring, together with each of the plurality of signal input transistors, a differential pair, and having a control terminal to which a reference signal is input; a signal input transistor selection section selecting any one of the plurality of signal input transistors, and generating a current in response to a difference between the input signal and the reference signal to flow in the differential pair configured with the selected signal input transistor and the reference input transistor; a load section converting, at a time of a change of a current flowing in any one of the plurality of signal input transistors and the reference input transistor in response to the difference, the change of the current into a change of a voltage, and outputting the change of the voltage as a result of comparison between the input signal and the reference signal; and a retention section retaining a digital signal in response to the reference signal on the basis of the output result of the comparison, and outputting the retained digital signal as a result of analog-to-digital conversion performed on the input signal. This produces a function of selecting any one of the plurality of signal input transistors and comparing the input signal of this selected signal input transistor with the reference signal.

Furthermore, according to a third aspect, there is provided a solid-state image pickup device including: a plurality of photoelectric conversion sections each generating a signal in response to incident light; a plurality of signal input transistors each having a control terminal to which the generated signal is input; a reference input transistor configuring, together with each of the plurality of signal input transistors, a differential pair, and having a control terminal to which a reference signal is input; a signal input transistor selection section selecting any one of the plurality of signal input transistors, and generating a current in response to a difference between the input signal and the reference signal to flow in the differential pair configured with the selected signal input transistor and the reference input transistor; a load section converting, at a time of a change of a current flowing in any one of the plurality of signal input transistors and the reference input transistor in response to the difference, the change of the current into a change of a voltage, and outputting the change of the voltage as a result of comparison between the input signal and the reference signal; and a retention section retaining a digital signal in response to the reference signal on the basis of the output result of the comparison, and outputting the retained digital signal as a result of analog-to-digital conversion performed on the generated signal. This produces a function of selecting any one of the plurality of signal input transistors and comparing the input signal of this selected signal input transistor with the reference signal.

Moreover, according to a fourth aspect, there is provided an image pickup apparatus including: a plurality of photoelectric conversion sections each generating a signal in response to incident light; a plurality of signal input transistors each having a control terminal to which the generated signal is input; a reference input transistor configuring, together with each of the plurality of signal input transistors, a differential pair, and having a control terminal to which a reference signal is input; a signal input transistor selection section selecting any one of the plurality of signal input transistors, and generating a current in response to a difference between the input signal and the reference signal to flow in the differential pair configured with the selected signal input transistor and the reference input transistor; a load section converting, at a time of a change of a current flowing in any one of the plurality of signal input transistors and the reference input transistor in response to the difference, the change of the current into a change of a voltage, and outputting the change of the voltage as a result of comparison between the generated signal and the reference signal; a retention section retaining a digital signal in response to the reference signal on the basis of the output result of the comparison, and outputting the retained digital signal as a result of analog-to-digital conversion performed on the generated signal; and a processing circuit processing the output digital signal. This produces a function of selecting any one of the plurality of signal input transistors and comparing the input signal of this selected signal input transistor with the reference signal.

Advantageous Effect of Invention

According to the present technique, it is possible to exhibit an excellent effect of simplifying a configuration of an analog-to-digital converter by causing a comparison section to select an analog signal from among a plurality of analog signals and to compare the selected analog signal with a reference signal. It is noted that effects are not always limited to those described here but may be any of effects described in the present disclosure.

BRIEF DESCRIPTION OF DRAWINGS

FIG. 7 illustrates an example of a configuration of a comparison output processing section 160 according to the first embodiment of the present technique.

FIG. 16 illustrates an example of a configuration of a pixel 100 according to a fifth embodiment of the present technique.

FIG. 21 illustrates examples of a configuration of a pulse width change section 164 according to the seventh embodiment of the present technique.

DESCRIPTION OF EMBODIMENTS

Modes for carrying out the present technique (hereinafter, referred to as embodiments) will be described hereinafter. Description will be given in the following order.
1. First embodiment (example in a case of using a comparison section that has a plurality of signal input transistors)
2. Second embodiment (example in a case of using a photoelectric conversion section that has a plurality of photodiodes)
3. Third embodiment (example in a case of using a comparison section that has a plurality of signal input transistors and a plurality of reference input transistors)
4. Fourth embodiment (example in a case of using a comparison section that has a plurality of signal input transistors, a plurality of reference input transistors, and a plurality of constant current power supplies)
5. Fifth embodiment (example in a case of changing an output pulse width from a comparison section)

1. First Embodiment

[Configuration of Image Pickup Apparatus]

Figure 1:
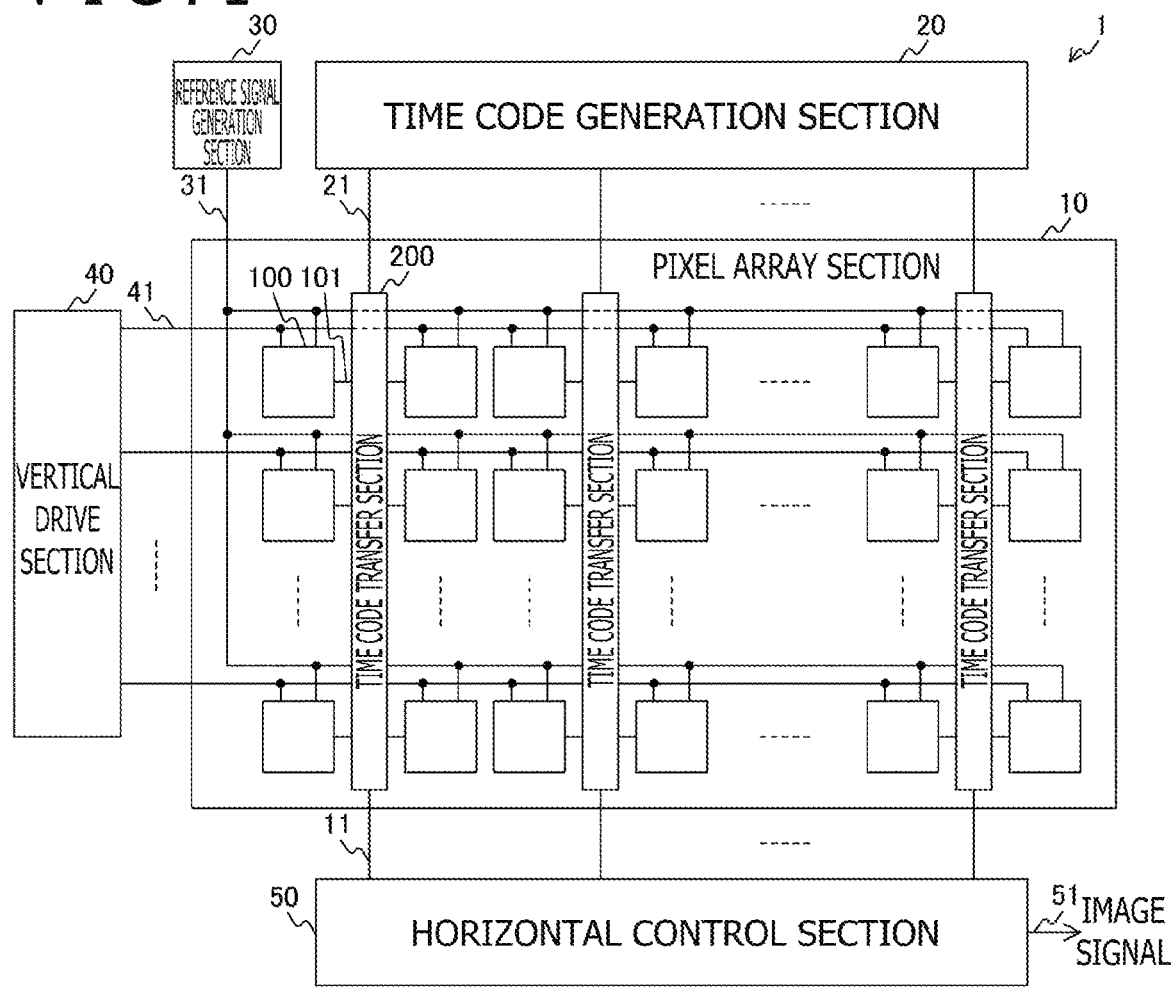
FIG. 1 illustrates an example of a configuration of an image pickup apparatus according to embodiments of the present technique.

FIG. 1 illustrates an example of a configuration of an image pickup apparatus 1 according to embodiments of the present technique. This image pickup apparatus 1 includes a pixel array section 10, a time code generation section 20, a reference signal generation section 30, a vertical drive section 40, and a horizontal control section 50.

The pixel array section 10 has a plurality of pixels 100 that are arranged therein and that generate image signals. This pixel array section 10 is configured with the pixels 100 that are arranged in a two-dimensional matrix and generate image signals, and a plurality of time code transfer sections 200 arranged among pixel columns. Each of the pixels 100 performs photoelectric conversion to generate an analog image signal, and performs analog-to-digital conversion on this analog image signal. The pixel 100 subsequently outputs a time code, to be described later, as a result of the analog-to-digital conversion. Each of the time code transfer sections 200 transfers this time code. Signal lines 101 are signal lines that connect the pixels 100 to the time code transfer sections 200. Details of configurations of the pixel 100 and the time code transfer section 200 will be described later. It is noted that the pixel array section 10 is an example of a solid-state image pickup device described in claims.

The time code generation section 20 generates the time code and outputs the time code to each of the time code transfer sections 200. The time code means herein a code that indicates elapsed time since start of analog-to-digital conversion in each pixel 100. This time code is of a size equal to a bit count of a digital image signal after conversion, and a gray code, for example, can be used as the time code. The time code is output to each time code transfer section 200 via a signal line 21.

The reference signal generation section 30 generates a reference signal and outputs the reference signal to each pixel 100. This reference signal is a signal that forms the basis of analog-to-digital conversion in the pixel 100, and a signal at a voltage falling in a ramp state, for example, can be used as the reference signal. This reference signal is output via a signal line 31. Furthermore, generation and output of the time code by the time code generation section 20 are executed synchronously with generation and output of the reference signal by the reference signal generation section 30. The time code and the reference signal output from the time code generation section 20 and the reference signal generation section 30 thereby have a one-to-one correspondence, and the voltage of the reference signal can be acquired from the time code. Time code decoding sections 52, to be described later, each decode the time code by acquiring the voltage of the reference signal from the time code.

The vertical drive section 40 generates control signals and the like with respect to each pixel 100 and outputs the control signal and the like to the pixel 100. The control signals are output to the pixel 100 via a signal line 41. Details of a configuration of the vertical drive section 40 will be described later.

The horizontal control section 50 processes the time code transferred by each time code transfer section 200. The time code is input to the horizontal control section 50 via a signal line 11. Details of a configuration of the horizontal control section 50 will be described later. It is noted that the horizontal control section 50 is an example of a processing circuit described in claims.

[Configuration of Vertical Control Section]

Figure 2:
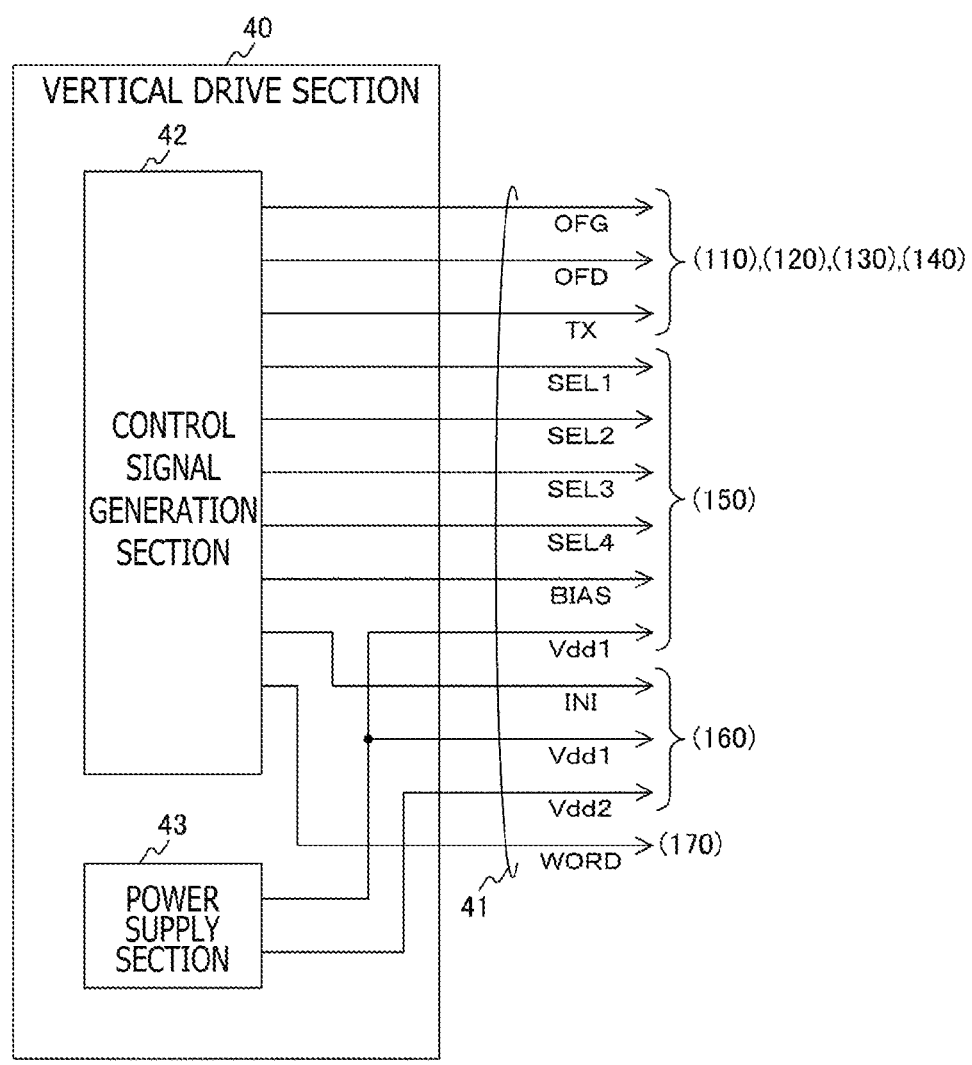
FIG. 2 illustrates an example of a configuration of a vertical drive section 40 according to the embodiments of the present technique.

FIG. 2 illustrates an example of the configuration of the vertical drive section 40 according to the embodiments of the present technique. This vertical drive section 40 includes a control signal generation section 42 and a power supply section 43.

The control signal generation section 42 generates control signals with respect to each pixel 100 and outputs the control signals to the pixel 100. The power supply section 43 supplies electric power necessary for the pixel 100 to operate. The control signals and the power are transmitted via the signal line 41. As depicted in FIG. 2, the signal line 41 is configured with a plurality of signal lines (OFG, OFD, TX, SEL1, SEL2, SEL3, SEL4, BIAS, INI, and WORD) and a plurality of power supply lines (Vdd1 and Vdd2). The signal lines (OFG, OFD, TX, SEL1, SEL2, SEL3, SEL4, BIAS, INI, and WORD) are connected to the control signal generation section 42 and transmit the control signals with respect to each pixel 100. On the other hand, the power supply lines (Vdd1 and Vdd2) are connected to the power supply section 43 and used to supply the power. Details of these signal lines will be described later.

[Configuration of Horizontal Control Section]

Figure 3:
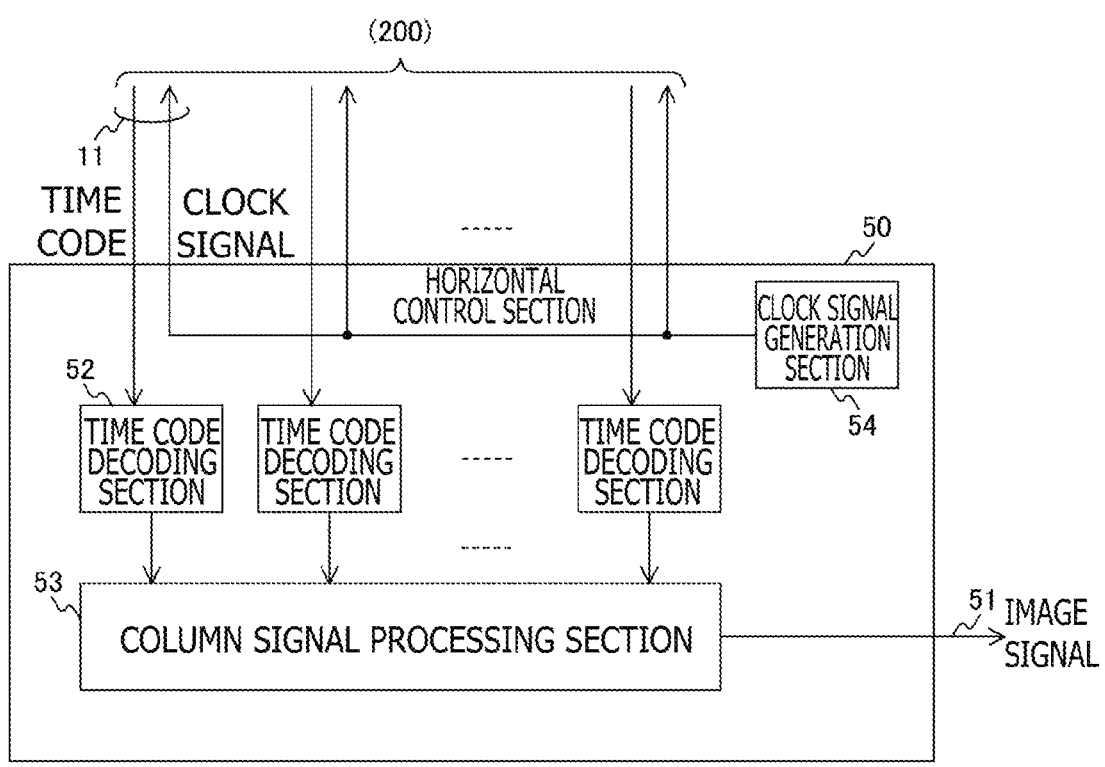
FIG. 3 illustrates an example of a configuration of a horizontal control section 50 according to the embodiments of the present technique.

FIG. 3 illustrates an example of the configuration of the horizontal control section 50 according to the embodiments of the present technique. This horizontal control section 50 includes the time code decoding sections 52, a column signal processing section 53, and a clock signal generation section 54.

The time code decoding sections 52 each decodes the time code. This decoding enables generation of a digital image signal that is the result of analog-to-digital conversion. The plurality of time code decoding sections 52 are arranged in the horizontal control section 50, and have a one-to-one correspondence to the time code transfer sections 200 arranged in the pixel array section 10. The time codes are simultaneously input to these time code decoding sections 52 from the corresponding time code transfer sections 200. These time code decoding sections 52 decode the input time codes simultaneously in parallel. A plurality of digital image signals obtained by decoding are then input to the column signal processing section 53.

The column signal processing section 53 processes the digital image signals output by the time code decoding sections 52. The column signal processing section 53 can perform, as this process, correlated double sampling (CDS) to be described later. In addition, the column signal processing section 53 performs horizontal transfer with respect to the processed digital image signals. This process is to sequentially transfer the processed image signals corresponding to the plurality of digital image signals simultaneously input to the column signal processing section 53 by the plurality of time code decoding sections 52. The image signals output from the column signal processing section 53 correspond to image signals output from the image pickup apparatus 1.

[Configuration of Pixel]

Figure 4:
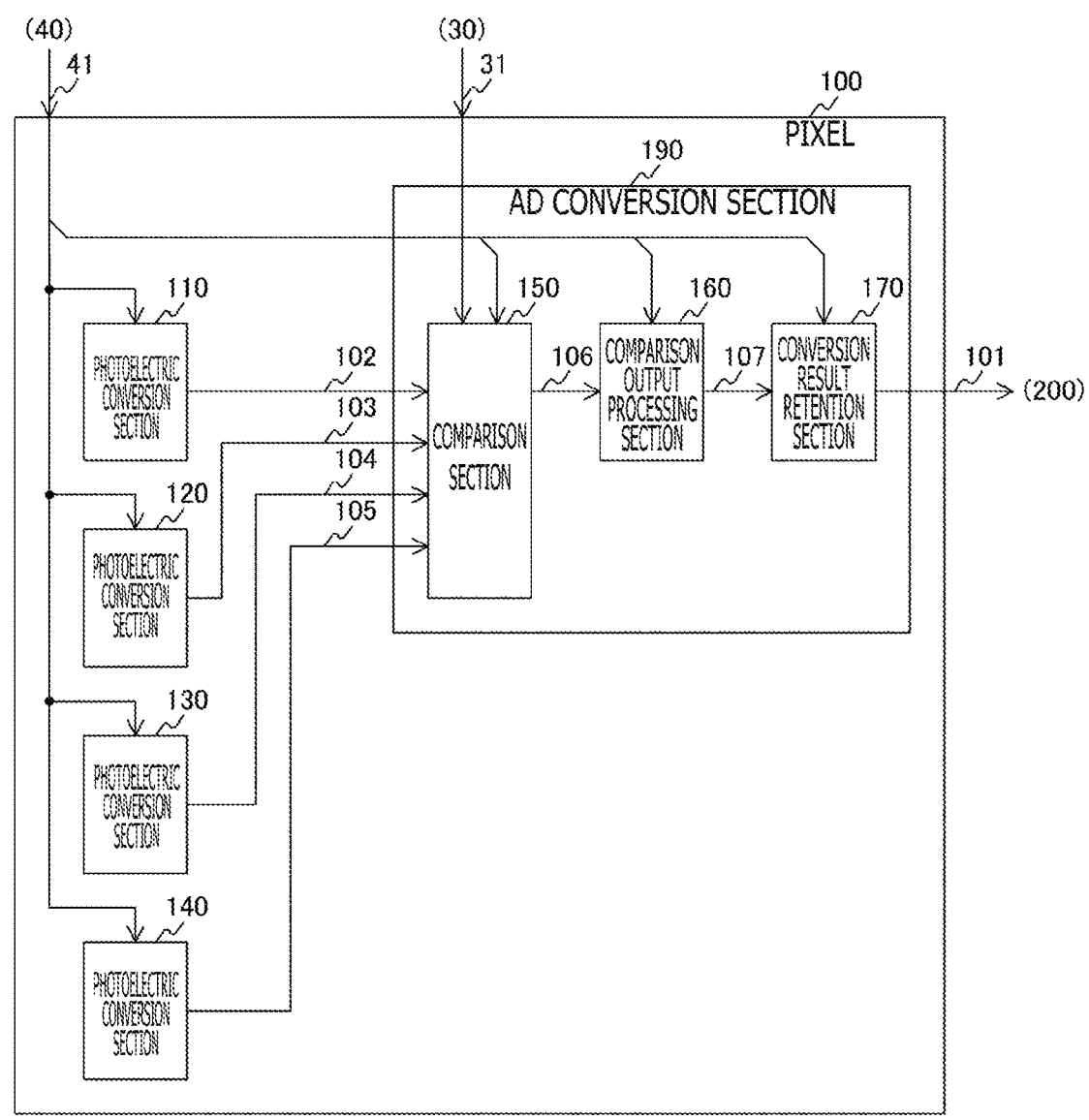
FIG. 4 illustrates an example of a configuration of a pixel 100 according to a first embodiment of the present technique.

FIG. 4 illustrates an example of the configuration of the pixel 100 according to the first embodiment of the present technique. This pixel 100 includes a photoelectric conversion section 110, a photoelectric conversion section 120, a photoelectric conversion section 130, a photoelectric conversion section 140, and an analog-to-digital conversion section (AD conversion section) 190.

The photoelectric conversion sections 110 to 140 each perform photoelectric conversion to generate an analog image signal in response to incident light and retain the analog image signal. Furthermore, the photoelectric conversion sections 110 to 140 are each controlled by the vertical drive section 40 to output the retained analog image signal to a comparison section 150 in the analog-to-digital conversion section 190. These analog image signals are output to the comparison section 150 via signal lines 102 to 105. Details of a configuration of the photoelectric conversion section 110 and the like will be described later.

The analog-to-digital conversion section 190 performs analog-to-digital conversion for converting the analog image signals generated by the photoelectric conversion section 110 and the like into digital image signals. This analog-to-digital conversion section 190 includes the comparison section 150, a comparison output processing section 160, and a conversion result retention section 170. It is noted that the analog-to-digital conversion section 190 is an example of an analog-to-digital converter described in claims.

The comparison section 150 compares the reference signal generated by the reference signal generation section 30 with one of the analog image signals output by the photoelectric conversion section 110 and the like. The comparison section 150 outputs a comparison result to the comparison output processing section 160 via a signal line 106. This comparison section 150 compares one of the plurality of analog image signals output from the photoelectric conversion section 110 and the like with the reference signal. In other words, the comparison section 150 compares a voltage of the analog image signal transmitted via one of the signal lines 102 to 105 with a voltage of the reference signal. The comparison result is output as an electrical signal. For example, the comparison section 150 can output a signal that takes on value "1" when the voltage of the analog image signal is lower than that of the reference signal, and a signal that takes on value "0" when the voltage of the analog image signal is higher than that of the reference signal. Details of a configuration of the comparison section 150 will be described later. It is noted that the comparison section 150 is an example of a comparator described in claims.

The comparison output processing section 160 processes the comparison result output by the comparison section 150 and outputs the processed comparison result to the conversion result retention section 170. The comparison output processing section 160 outputs the processed comparison result to the conversion result retention section 170 via a signal line 107. The comparison output processing section 160 can perform, for example, level conversion or waveform shaping as this process.

The conversion result retention section 170 retains the time code output from the time code transfer section 200 as a result of the analog-to-digital conversion on the basis of the processed comparison result output by the comparison output processing section 160. This conversion result retention section 170 retains the time code output from the time code transfer section 200 when a value of the comparison result changes, for example, from "1" to "0." The time code at this time is the time code generated by the time code generation section 20 and transferred to the pixel 100 by the time code transfer section 200. Subsequently, the conversion result retention section 170 outputs the retained time code to the time code transfer section 200 under control of the vertical drive section 40. The time code transfer section 200 transfers this output time code to the time code decoding section 52 of the horizontal control section 50.

As described above, the signal the voltage of which changes from a high voltage to a low voltage in a ramp state is used as the reference signal, and the conversion result retention section 170 can retain the time code at a time at which the voltage of this reference signal transitions from the higher state than the voltage of the analog image signal into the lower state. In other words, the time code at the time at which the analog image signal is substantially equal to the reference signal is retained in the conversion result retention section 170. The time code decoding section 52 converts the retained time code into a digital signal that represents the voltage of the reference signal at corresponding time. It is thereby possible to perform analog-to-digital conversion on the analog image signal generated by the photoelectric conversion section 110. It is noted that the conversion result retention section 170 is an example of a retention section described in claims.

[Configuration of Photoelectric Conversion Section]

Figure 5:
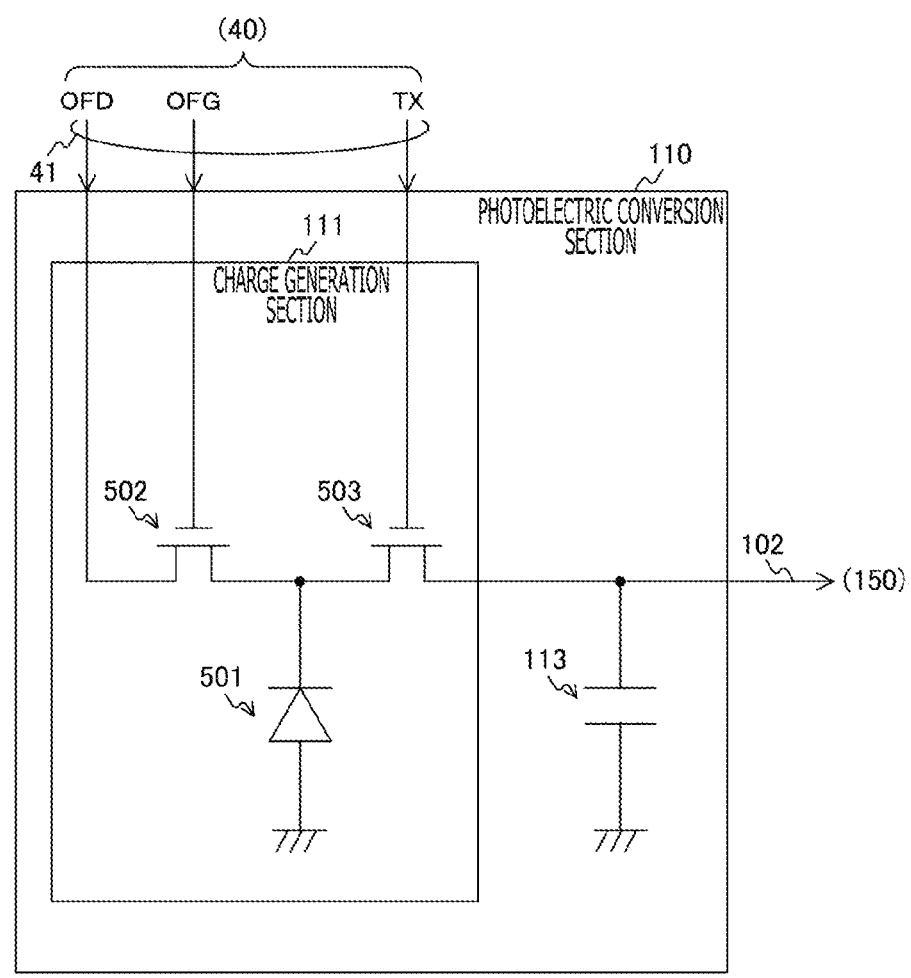
FIG. 5 illustrates an example of a configuration of a photoelectric conversion section 110 according to the first embodiment of the present technique.

FIG. 5 illustrates an example of the configuration of the photoelectric conversion section 110 according to the first embodiment of the present technique. This photoelectric conversion section 110 includes a charge generation section 111 and a generated charge retention section 113. Furthermore, the charge generation section 111 includes MOS transistors 502 and 503 and a photodiode 501. N channel MOS transistors can be used herein as the MOS transistors 502 and 503. In addition, the plurality of signal lines (OFD, OFG, and TX) are connected to the photoelectric conversion section 110. The overflow drain signal line OFD (Overflow Drain) is a signal line that supplies a reset voltage with respect to the photodiode 501. The overflow gate signal line OFG is a signal line that transmits a control signal to the MOS transistor 502. The transistor signal line TX (Transfer) is a signal line that transmits a control signal to the MOS transistor 503. As depicted in FIG. 5, the overflow gate signal line OFG and the transfer signal line TX are both connected to gates of the MOS transistors. When a voltage equal to or higher than a threshold voltage between the gate and a source (hereinafter, referred to as ON signal) is input to the corresponding MOS transistor via any of these signal lines, the MOS transistor is turned into a conductive state.

A drain and the gate of the MOS transistor 502 are connected to the overflow drain signal line OFD and the overflow gate signal line OFG, respectively. A source of the MOS transistor 502 is connected to a cathode of the photodiode 501 and to a source of the MOS transistor 503. An anode of the photodiode 501 is grounded. The gate of the MOS transistor 503 is connected to the transfer signal line TX, while a drain thereof is connected to the signal line 102 and one end of the generated charge retention section 113. The other end of the generated charge retention section 113 is grounded.

The photodiode 501 generates electric charge in response to luminous energy of light with which the photodiode 501 is irradiated and retains the generated charge.

The MOS transistor 502 discharges the charge excessively generated by the photodiode 501. Furthermore, this MOS transistor 502 establishes continuity between the photodiode 501 and the overflow drain signal line OFD, thereby further discharging the charge accumulated in the photodiode 501. In other words, the MOS transistor 502 further works on resetting the photodiode 501.

The MOS transistor 503 transfers the charge generated by the photodiode 501 to the generated charge retention section 113. This MOS transistor 503 transfers the charge by establishing continuity between the photodiode 501 and the generated charge retention section 113.

The generated charge retention section 113 retains the charge transferred by the MOS transistor 503. As this generated charge retention section 113, a floating diffusion region generated in a diffusion layer of a semiconductor substrate can be used. A signal in response to the charge retained in this generated charge retention section 113 corresponds to the analog image signal generated by the photoelectric conversion section 110, and the signal is output to the comparison section 150 via the signal line 102.

Since the photoelectric conversion sections 120 to 140 are similar in configuration to the photoelectric conversion section 110, description thereof will be omitted. The analog image signals generated by the photoelectric conversion sections 120 to 140 are output to the comparison section 150 via the signal lines 103 to 105, respectively.

[Configuration of Comparison Section]

Figure 6:
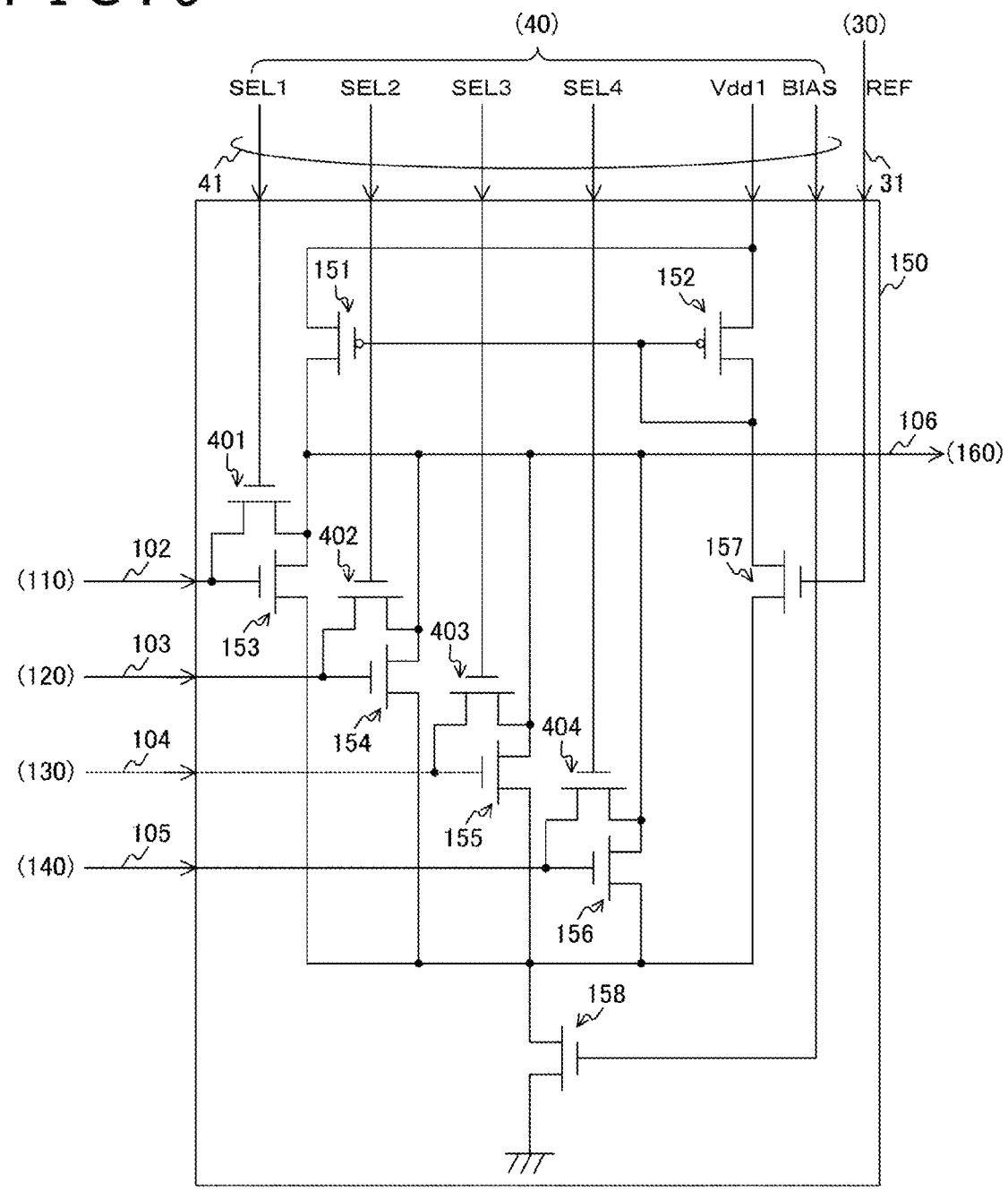
FIG. 6 illustrates an example of a configuration of a comparison section 150 according to the first embodiment of the present technique.

FIG. 6 illustrates an example of the configuration of the comparison section 150 according to the first embodiment of the present technique. This comparison section 150 includes signal input transistors 153, 154, 155, and 156, a reference input transistor 157, and MOS transistors 151, 152, 158, 401, 402, 403, and 404. P channel MOS transistors can be used herein as the MOS transistors 151 and 152. N channel MOS transistors can be used as the MOS transistors 158, 401, 402, 403, and 404. Likewise, N channel MOS transistors can be used as the signal input transistors 153, 154, 155, and 156 and the reference input transistor 157. It is noted that the MOS transistor 151 is an example of a load section described in claims. The MOS transistors 401, 402, 403, and 404 are an example of a signal input transistor selection section described in claims.

Furthermore, the plurality of signal lines (SEL1 to SEL4, BIAS, and REF) and the power supply line Vdd1 in addition to the signal line 102 and the like described above are connected to the comparison section 150. The selection signal lines SEL (Select)1 to SEL4 are signal lines that transmit control signals to the MOS transistors 401, 402, 403, and 404, respectively. The bias signal line BIAS (Bias) is a signal line that supplies a bias voltage to the MOS transistor 158. The reference signal line REF (Reference) is a signal line that transmits the reference signal to the reference input transistor 157. The power supply line Vdd1 is a power supply line that supplies the power for the comparison section 150.

Sources of the MOS transistors 151 and 152 are commonly connected to the power supply line Vdd1. A gate of the MOS transistor 151 is connected to a gate and a drain of the MOS transistor 152 and a drain of the reference input transistor 157. A drain of the MOS transistor 151 is connected to drains of the signal input transistors 153 to 156, drains of the MOS transistors 401 to 404, and the signal line 106. Sources of the signal input transistors 153 to 156 and a source of the reference input transistor 157 are commonly connected to a drain of the MOS transistor 158. A gate of the MOS transistor 158 is connected to the bias signal line BIAS and a source thereof is grounded. Gates of the MOS transistors 153 to 156 are connected to the signal lines 102 to 105, respectively. A gate and a source of the MOS transistor 401 are connected to the selection signal line SEL1 and the signal line 102, respectively. A gate and a source of the MOS transistor 402 are connected to the selection signal line SEL2 and the signal line 103, respectively. A gate and a source of the MOS transistor 403 are connected to the selection signal line SEL3 and the signal line 104, respectively. A gate and a source of the MOS transistor 404 are connected to the selection signal line SEL4 and the signal line 105, respectively. A gate of the reference input transistor 157 is connected to the reference signal line REF.

The signal input transistors 153 to 156 are MOS transistors having the gates to which input signals are input and which are control terminals. The analog image signals are input, as the input signals, to the signal input transistors 153 to 156 in FIG. 6. The drains of these signal input transistors 153 to 156 are commonly connected and sources thereof are commonly connected. In other words, these signal input transistors are connected in parallel.

The reference input transistor 157 is a MOS transistor having the gate to which the reference signal is input and which is a control terminal. This reference input transistor 157 and each of the signal input transistors 153 to 156 connected in parallel as described above configure a differential pair. This differential pair compares the input signal with the reference signal. Specifically, in a case in which the input signal is lower than the reference signal, a current flowing in the reference input transistor 157 is higher than a current flowing in one of the signal input transistors 153 to 156. Conversely, in a case in which the input signal is higher than the reference signal, the current flowing in the reference input transistor 157 is lower than the current flowing in one of the signal input transistors 153 to 156. In this way, the currents in response to a difference between the input signal and the reference signal flow in one of the signal input transistors 153 to 156 and the reference input transistor 157.

The MOS transistors 401 to 404 select any one of the signal input transistors 153 to 156. Only one of the signal input transistors 153 to 156 selected by the MOS transistors 401 to 404 is used for the comparison. The selected analog image signal is thereby compared with the reference signal. Details of selection by the MOS transistors 401 to 404 will be described later.

The MOS transistor 151 converts, at a time of a change of the current flowing in any one of the signal input transistors 153 to 156 and the reference input transistor 157 in response to the difference between the input signal and the reference signal, the change of the current into a change of a voltage. In addition, the MOS transistor 152 converts a change of the current flowing in the reference input transistor 157 into a change of a voltage. These MOS transistors 151 and 152 configure a current mirror circuit. This current mirror circuit acts to allow the current equal to the current flowing in the reference input transistor 157 to flow in the signal input transistors 153 to 156. It is thereby possible to compare the input signal with the reference signal at a high speed.

The MOS transistor 158 controls the currents flowing in each of the signal input transistors 153 to 156 and the reference input transistor 157 configuring the differential pair. The predetermined bias voltage is supplied to the gate of this MOS transistor 158 via the bias signal line BIAS. The MOS transistor 158 thereby operates as a constant current power supply.

In this way, the comparison section 150 depicted in FIG. 6 has the plurality of signal input transistors 153 to 156 and selects one of these and can perform a comparison operation. Furthermore, the comparison section 150 is configured such that the reference input transistor 157 and the current mirror circuit configured with the MOS transistors 151 and 152 are shared among the plurality of signal input transistors. This can make simple a configuration of the pixel 100, compared with a case in which a plurality of comparison sections are used to compare outputs from the photoelectric conversion sections 110 to 140 with the reference signal.

[Selection Method]

A method of selecting one of the signal input transistors 153 to 156 by the MOS transistors 401 to 404 will be described while taking a case of selecting the signal input transistor 153 by way of example. First, a voltage of the reference signal line REF is set to 0 V. This turns the reference input transistor 157 into a non-conductive state. Voltages of the drains of the signal input transistors 153 to 156 become closer to 0 V by an action of a differential amplifier circuit configured with the signal input transistors 153 to 156, the reference input transistor 157, and the MOS transistor 158. Next, ON signals are input to the selection signal lines SEL1 to SEL4, thus turning the MOS transistors 401 to 404 into a conductive state. A feedback circuit is thereby formed, and the voltages of the drains of the signal input transistors 153 to 156 become approximately 0 V. The generated charge retention sections 113 of the photoelectric conversion sections 110 to 140 connected to the signal lines 102 to 105 are then discharged, so that voltages of the signal lines 102 to 105 become 0 V.

This can turn the signal input transistors 153 to 156 into an unselected state. Subsequently, input of the ON signals to the selection signal lines SEL1 to SEL4 is stopped, the voltage of the reference signal line REF is set to the bias voltage at which the signal input transistor 153 is turned into a conductive state, and an ON signal is input to the selection signal line SEL1, thereby turning the MOS transistor 401 into a conductive state. The signal input transistor 153 can be thereby selected. In this way, the MOS transistors 401 to 404 select one of the signal input transistors 153 to 156.

The comparison section 150 in FIG. 6 is provided with the current mirror circuit configured with the MOS transistors 151 and 152, so that it is possible to further enhance an action of setting the voltage of the drain of the signal input transistor 153 to 0 V. In other words, at a time of setting the voltage of the reference signal line REF to 0 V, a current flowing in the MOS transistor 152 becomes approximately 0 A. Since the MOS transistor 151 configures, together with the MOS transistor 152, the current mirror circuit, a current flowing in the MOS transistor 151 also becomes approximately 0 V. Owing to this, it is possible to more accurately set the voltage of the drain of the signal input transistor 153 to 0 V.

It is noted that these MOS transistors 401 to 404 further include a function to reset the charge generation sections 113 of the photoelectric conversion sections 110 to 140. This resetting can be performed as follows. First, a voltage corresponding to a reset voltage for resetting the generated charge retention sections 113 is applied to the reference signal line REF. The reference input transistor 157 is thereby turned into a conductive state. Actions of the differential amplifier circuit and the current mirror circuit described above enable voltages of the drains of the MOS transistors 401 to 404 to be substantially equal to the reset voltage. Next, the ON signals are input to the selection signal lines SEL1 to SEL4, thus turning the MOS transistors 401 to 404 into a conductive state. The reset voltage is thereby applied to the generated charge retention sections 113 of the photoelectric conversion sections 110 to 140 to make it possible to reset the generated charge retention sections 113.

In this way, according to the first embodiment of the present technique, the MOS transistors 401 to 404 select one of the signal input transistors 153 to 156 and reset the generated charge retention sections 113. This can simplify the configuration of the analog-to-digital conversion section 190. Furthermore, using the current mirror circuit makes it possible to improve a gain of the differential amplifier circuit; thus, the MOS transistors 401 to 404 can select one of these signal input transistors 153 to 156 and reset the generated charge retention sections 113 more accurately.

It is noted that the configuration of the comparison section 150 is not limited to this example. For example, resistance loads or constant current power supplies can be used as an alternative to the MOS transistors 151 and 152 that configure the current mirror circuit. In this alternative, the resistance loads or the like can be connected to any one of or both of the individual differential pairs of the signal input transistors 153 to 156 and the reference input transistor 157.

[Configuration of Comparison Output Processing Section]

FIG. 7 illustrates an example of the configuration of the comparison output processing section 160 according to the first embodiment of the present technique. This comparison output processing section 160 includes MOS transistors 511 to 517. The MOS transistors 511, 513, and 515 can be configured herein with P channel MOS transistors. In addition, the MOS transistors 512, 514, 516, and 517 can be configured with N channel MOS transistors. It is noted that the MOS transistor 511 configures a preamplification section 161. The MOS transistor 512 configures a level conversion section 162. The MOS transistors 513 to 517 configure a waveform shaping section 163. Furthermore, the initialization signal line INI (Initialize) and the power supply lines (Vdd1 and Vdd2) in addition to the signal lines 106 and 107 described above are connected to the comparison output processing section 160. The initialization signal line INI is a signal line that transmits control signals to the MOS transistors 513 and 516. The power supply lines Vdd1 and Vdd2 are power supply lines that supply the power to the comparison output processing section 160.

A source and a gate of the MOS transistor 511 are connected to the power supply line Vdd1 and the signal line 106, respectively. A drain of the MOS transistor 511 is connected to a drain of the MOS transistor 512. A gate of the MOS transistor 512 is connected to the power supply line Vdd2, while a source thereof is connected to drains of the MOS transistors 514 and 516 and gates of the MOS transistors 515 and 517. Gates of the MOS transistors 513 and 516 are commonly connected to the initialization signal line INI. A source and a drain of the MOS transistor 513 are connected to the power supply line Vdd2 and a source of the MOS transistor 514, respectively. A source of the MOS transistor 516 is grounded. A gate of the MOS transistor 514 is connected to drains of the MOS transistors 515 and 517 and the signal line 107. A source of the MOS transistor 515 is connected to the power supply line Vdd2 and a source of the MOS transistor 517 is grounded.

The preamplification section 161 amplifies a signal corresponding to the comparison result output by the comparison section 150. This preamplification section 161 outputs the amplified signal to the level conversion section 162. It is the MOS transistor 511 that performs this amplification.

The level conversion section 162 converts a level of the signal output by the preamplification section 161. The power supply line Vdd1 is connected to the comparison section 150 described with reference to FIG. 6 and to the preamplification section 161. For the comparison section 150 and the preamplification section 161 to obtain high gains, it is necessary to set a voltage of the power supplied by this power supply line Vdd1 to be relatively high. On the other hand, since the conversion result retention section 170 and the like in a rear stage handle digital signals, the power at a relatively low voltage can be supplied to the conversion result retention section 170 and the like. This relatively low voltage power is supplied by the power supply line Vdd2. It is thereby possible to reduce power consumption in the conversion result retention section 170 and the like and use low-breakdown voltage transistors in the conversion result retention section 170 and the like. The level conversion section 162 is arranged for transmission of signals among the circuits to which the power at different voltages is supplied as described above. The level conversion section 162 thereby outputs the level-converted signal to the waveform shaping section 163. The level conversion section 162 in FIG. 7 can limit the level of the signal to a voltage obtained by subtracting a threshold value of the MOS transistor 512 from a power supply voltage supplied by the power supply line Vdd2.

The waveform shaping section 163 shapes the signal output by the level conversion section 162 into an abruptly-changing signal. Operation of this waveform shaping section 163 will be described. In an initial state, the output from the level conversion section 162 takes on value "0." In this state, a signal that takes on value "1" is input to the level conversion section 162 from the initialization signal line INI, thus turning the MOS transistor 516 into a conductive state. This turns the MOS transistor 517 into a non-conductive state and the MOS transistor 515 into a conductive state, and value "1" is output to the signal line 107. At this time, the MOS transistors 513 and 514 are turned into a non-conductive state. Subsequently, a signal that takes on value "0" is input to the initialization signal line INI. This turns the MOS transistor 513 into a conductive state and the MOS transistor 516 into a non-conductive state. Since the MOS transistor 514 is in the non-conductive state and the output signal from the level conversion section 162 takes on value "0," the states of the MOS transistors 515 and 517 do not change.

Next, when the value of the output signal from the level conversion section 162 changes from "0" to "1," the state of the MOS transistor 517 transitions into a conductive state and that of the MOS transistor 515 transitions into a non-conductive state. A voltage of the signal line 107 thereby falls. Owing to this, the state of the MOS transistor 514 transitions into a conductive state, and voltages of the gates of the MOS transistors 515 and 517 further rise. Such a positive feedback action causes an abrupt fall in the voltage of the signal line 107. The waveform shaping section 163 can thereby perform waveform shaping.

[Configuration of Conversion Result Retention Section]

Figure 8:
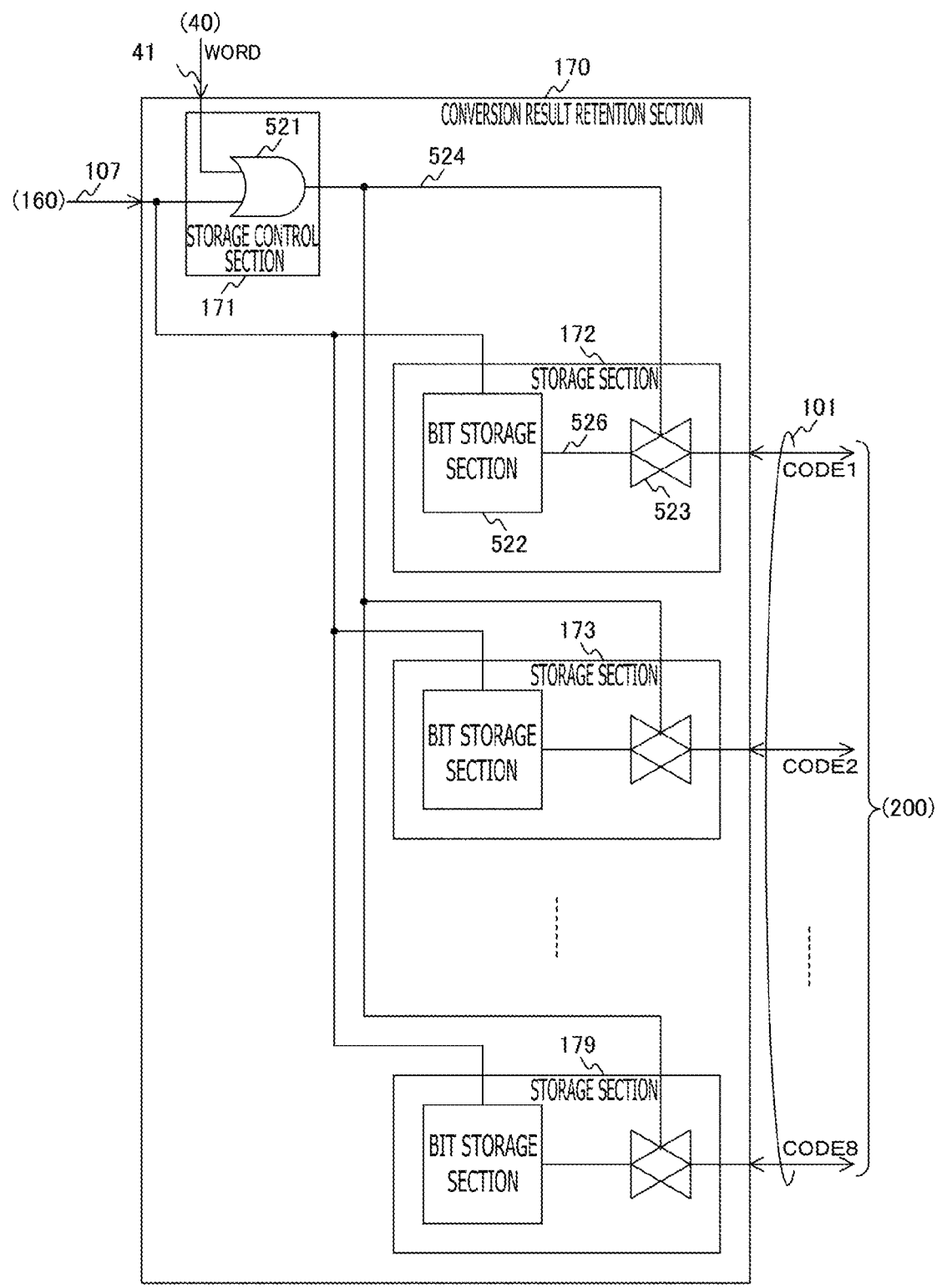
FIG. 8 illustrates an example of a configuration of a conversion result retention section 170 according to the embodiments of the present technique.

FIG. 8 illustrates an example of the configuration of the conversion result retention section 170 according to the embodiments of the present technique. This conversion result retention section 170 includes a storage control section 171 and storage sections 172 to 179. For the sake of convenience, data of a size of eight bits is assumed as the digital image signal after the analog-to-digital conversion. Owing to this, a size of the time code is also eight bits. It is noted that the sizes of the digital image signal after the conversion and the time code can be changed in accordance with system requirements. The sizes can be changed to, for example, 15 bits.

Furthermore, the plurality of signal lines (WORD and CODE1 to CODE8) in addition to the signal line 107 are connected to the conversion result retention section 170. The word signal line WORD (Word) is a signal line that transmits control signals with respect to the storage sections 172 to 179. Code signal lines CODE (Code)1 to CODE8 are signal lines that bidirectionally transmit the time codes. The plurality of code signal lines CODE1 to CODE8 configure the signal lines 101.

The storage sections 172 to 179 store the time codes input from the time code transfer sections 200. Each of the storage sections 172 to 179 stores the one-bit time code. A configuration of the storage sections 172 to 179 will be described while taking the storage section 172 by way of example. This storage section 172 includes a bit storage section 522 and a bidirectional switch 523.

The bidirectional switch 523 is connected between a signal line 526 and the code signal line CODE1 and transmits data bidirectionally. In addition, this bidirectional switch 523 includes a control input terminal. A signal line 524 is connected to this control input terminal. When value "1" is input to the control input terminal via the signal line 524, the bidirectional switch 523 is turned into a conductive state; thus, data can be bidirectionally transmitted between the signal line 526 and the code signal line CODE1. On the other hand, when value "0" is input to the control input terminal, the bidirectional switch 523 is turned into a non-conductive state.

The bit storage section 522 is a storage device that stores one-bit data. This bit storage section 522 includes an input/output terminal and a control input terminal, and the signal lines 526 and 107 are connected to the respective input/output terminal and the control input terminal. When a signal that takes on value "1" is input to the control input terminal via the signal line 107, the bit storage section 522 stores the one-bit time code that is the signal transmitted from the bidirectional switch 523 via the signal line 526. At that time, in a case in which the one-bit time code has a change, the data stored in the bit storage section 522 is rewritten. Subsequently, when the value of the signal input to the control input terminal transitions from "1" to "0," the data stored in the bit storage section 522 is retained as it is. In other words, the data is not rewritten until the value of the signal input to the control input terminal becomes "1" next. In addition, when the signal input to the control input terminal takes on value "0," the bit storage section 522 outputs the retained data to the signal line 526.

The storage control section 171 outputs the control signals via the signal line 524 and controls the storage sections 172 to 179. This storage control section 171 can generate and output, as a control signal with respect to each bidirectional switch 523, a signal obtained by, for example, logical OR between two signals input by the word signal line WORD and the signal line 107. This operation can be performed by an OR gate 521.

[Configuration of Time Code Transfer Section]

Figure 9:
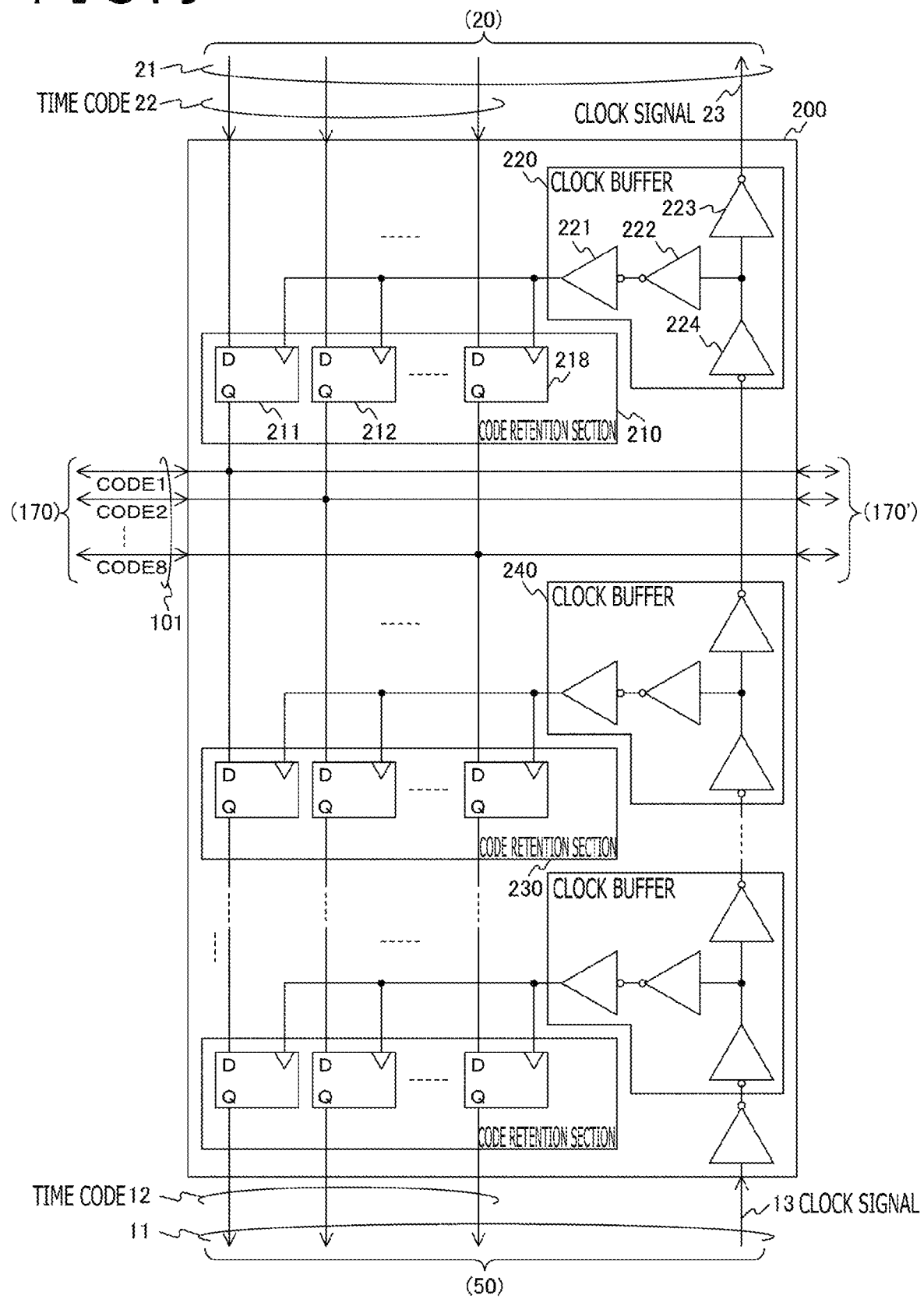
FIG. 9 illustrates an example of a configuration of a time code transfer section 200 according to the embodiments of the present technique.

FIG. 9 illustrates an example of the configuration of the time code transfer section 200 according to the embodiments of the present technique. This time code transfer section 200 includes code retention sections 210 and 230 and clock buffers 220 and 240. This time code transfer section 200 has the code retention sections and the clock buffers as many as rows of the pixels 100 arranged in the pixel array section 10 described with reference to FIG. 1. For the sake of convenience, the code retention sections and the clock buffers will be described while taking the code retention sections 210 and 230 and the clock buffers 220 and 240 by way of example.

The code retention section 210 retains the time code. This code retention section 210 is configured with flip-flops 211 to 218. The flip-flops 211 and the like each hold one bit out of the time code on the basis of a clock signal output from the clock buffer 220. Specifically, when the clock signal takes on value "0," each of the flip-flops 211 and the like retains the time code output from the time code generation section 20 and input to a D input terminal in FIG. 9 in an internal node and turns a Q output terminal into a high impedance state. Next, when the clock signal takes on value "1," each of the flip-flops 211 and the like outputs the time code retained in the internal node from the Q output terminal. This output time code is input to the code retention section 230 via the signal lines 101. In this way, the time code transfer section 200 causes the plurality of time code retention sections as shift registers and transfers the time code.

The clock buffer 220 outputs the clock signal generated by the clock signal generation section 54 described with reference to FIG. 3 to the code retention section 210 and to the clock buffer in a next stage. This clock buffer 220 is configured with a plurality of inverting gates 221 to 224 and operates as a repeater that shapes a degraded clock signal. Furthermore, this clock buffer 220 sequentially transfers the clock signal in an opposite direction to a direction of the time code in the time code transfer section 200. In other words, the clock buffer 240 outputs the clock signal to the code retention section 230 and outputs the clock signal to the clock buffer 220. As a result, the clock signal input to the code retention section 210 has a time delay corresponding to propagation delay time by as much as two inverting gates and a delay caused by an interconnect line to the inverting gate 224, compared with the clock signal input to the code retention section 230. In this way, the clock buffer 220 further includes a function to delay the clock signal.

As described above, the flip-flop 211 and the like each retain the input time code in the internal code when the clock signal takes on value "0." At a time of this retention, each of the flip-flops 211 and the like needs to secure predetermined time or so-called setup time. Because of the delay of the clock signal generated by the clock buffer 220, a value of the clock signal input to the code retention section 210 remains "1" when the value of the clock signal transitions into "0" in the code retention section 230. In other words, the time code retained in the internal node is kept in a state in which the time code has been output. It is thereby possible to secure the setup time in the code retention section 230 and transmit the time code.

The code signal lines CODE1 to CODE8 are connected to an output of the code retention section 210 and an input of the code retention section 230. The time code generated by the time code generation section 20 and retained in the code retention section 210 is thereby output to the conversion result retention section 170 via these code signal lines CODE1 to CODE8. Furthermore, the time code retained in the conversion result retention section 170 after the analog-to-digital conversion is output to the code retention section 230 via these code signal lines CODE1 to CODE8. In this way, the time code transfer section 200 transfers the time code.

[Analog-to-Digital Conversion Process]

Figure 10:
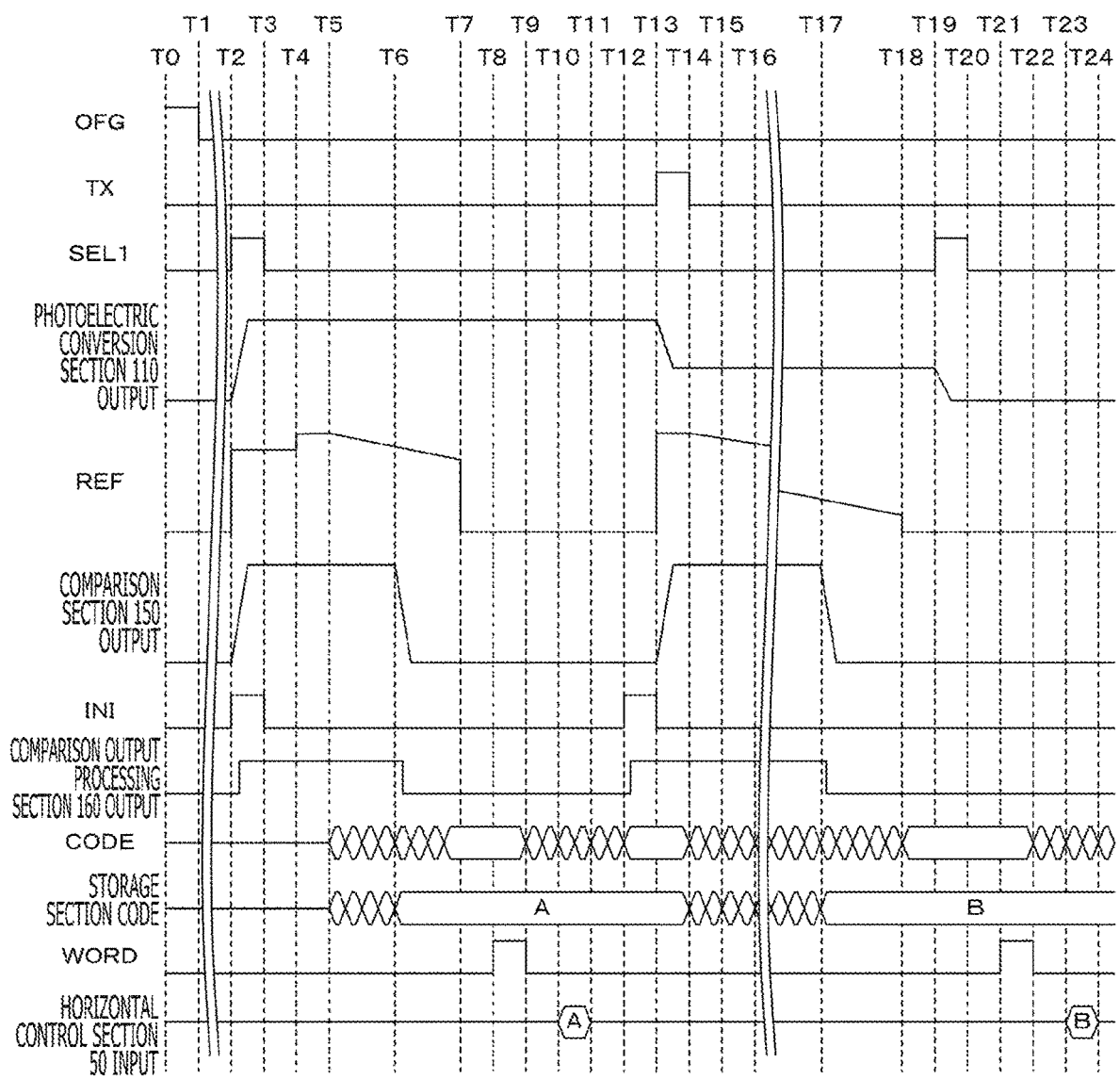
FIG. 10 illustrates an example of an analog-to-digital conversion process according to the first embodiment of the present technique.

FIG. 10 illustrates an example of an analog-to-digital conversion process according to the first embodiment of the present technique. FIG. 10 represents the analog-to-digital conversion process performed by the photoelectric conversion section 110 described with reference to FIG. 4. In FIG. 10, OFG, TX, SEL1, INI, and WORD represent states of the signals input to the overflow gate signal line OFG, the transfer signal line TX, the selection signal line SEL1, the initialization signal line INI, and the word signal line WORD, respectively. In each of these states, a period in which a binarized waveform takes on value "1" corresponds to input of an ON signal. PHOTOELECTRIC CONVERSION SECTION 110 OUTPUT, REF, COMPARISON SECTION 150 OUTPUT, and COMPARISON OUTPUT PROCESSING SECTION 160 OUTPUT represent states of the output signal from the photoelectric conversion section 110, the reference signal of the reference signal line REF, the output signal from the comparison section 150, and the output signal from the comparison output processing section 160, respectively. CODE, STORAGE SECTION CODE, and HORIZONTAL CONTROL SECTION 50 INPUT represent the time code transmitted by the code signal lines CODE, the time code stored in the storage sections 172 to 179, and the time code (of eight bits) input to the horizontal control section 50, respectively.

From T0 to T1, an ON signal is input to the overflow gate signal line OFG and the photodiode 501 of the photoelectric conversion section 110 is reset. Exposure of the photoelectric conversion section 110 to the light is thereby started.

From T2 to T3, the voltage corresponding to the reset voltage for resetting the generated charge retention section 113 is applied to the reference signal line REF. The output from the comparison section 150 thereby takes on a value substantially equal to the reset voltage. At the same time, an ON signal is input to the selection signal line SEL1. The generated charge retention section 113 is thereby reset. Furthermore, an ON signal is input to the initialization signal line INI and the output from the comparison output processing section 160 takes on value "1."

From T4 to T7, the reference signal is input to the reference signal line REF. As depicted in FIG. 10, this reference signal is a signal at a voltage falling in a ramp state. A time code is generated synchronously with the input of this reference signal and transferred by the time code transfer section 200. The transferred time code is stored in the storage sections 172 to 179. It is noted that the code stored in the storage sections 172 to 179 is rewritten while the value of the output signal from the comparison output processing section 160 is "1" (from T5 to T6).

When the voltage of the reference signal falls to be lower than the voltage of the output signal from the photoelectric conversion section 110, the output signal from the comparison section 150 falls (T6). This output signal from the comparison section 150 is shaped by the comparison output processing section 160, and the comparison output processing section 160 outputs the signal that takes on value "0" to the conversion result retention section 170. The rewriting of the time code stored in the storage sections 172 to 179 is then stopped and the time code is retained. The retained time code is denoted herein by "A." This time code "A" is a signal corresponding to the image signal at the time of resetting the photoelectric conversion section 110. After passage of predetermined time, the reference signal of the reference signal line REF takes on value "0" and the transfer of the time code is stopped (T7).

From T8 to T11, an ON signal is input to the word signal line WORD (from T8 to T9), the time code "A" retained in each of the storage sections 172 to 179 is output to the time code transfer section 200. Subsequently, the time code "A" is transferred by the time code transfer section 200 and input to the horizontal control section 50 (from T9 to T11). The input time code "A" is decoded by the time code decoding section 52 and the decoded time code is retained in the column signal processing section 53 as the image signal at the time of resetting.

From T12 to T18, an ON signal is input to the initialization signal line INI (from T12 to T13) and the output from the comparison output processing section 160 takes on value "1." Next, an ON signal is input to the transfer signal line TX (from T13 to T14), the charge retained in the photodiode 501 is transferred to and retained in the generated charge retention section 113. The signal (analog image signal) in response to the charge retained in the generated charge retention section 113 is output from the photoelectric conversion section 110 to the comparison section 150. Subsequently, the reference signal is input to the reference signal line REF and the time code is transferred (from T14 to T18). When the voltage of the reference signal falls to be lower than the voltage of the output signal from the photoelectric conversion section 110 (T17), then a signal that takes on value "0" is output to the conversion result retention section 170 in a similar manner as that at T6, and the time code is retained in the storage sections 172 to 179. The retained time code at this time is denoted herein by "B." This time code "B" is a signal corresponding to the image signal after exposure of the photoelectric conversion section 110 to the light. After passage of predetermined time, the input of the reference signal is stopped and the voltage value of the reference signal becomes approximately 0 V (T18).

A period from the input of the ON signal to the overflow gate signal line OFG from T0 to T1 to the input of the ON signal to the transfer signal line TX from T13 to T14 corresponds to an exposure period.

From T19 to T20, an ON signal is input to the selection signal line SEL1. As described above, since the voltage of the reference signal is approximately 0 V, the voltage of the output from the photoelectric conversion section 110 becomes approximately 0 V. The generated charge retention section 113 is thereby discharged to approximately 0 V, and the signal input transistor 153 of the comparison section 150 is turned into an unselected state.

From T21 to T24, an ON signal is input to the word signal line WORD (from T21 to T22), and the time code "B" is output to the time code transfer section 200. Subsequently, from T22 to T24, the time code "B" is transferred by the time code transfer section 200 and input to the horizontal control section 50. The input time code "B" is decoded into the image signal after exposure, and the image signal is input to the column signal processing section 53. Subsequently, the column signal processing section 53 subtracts the image signal at the time of resetting from the input image signal after exposure. The column signal processing section 53 thereby executes the CDS on the image signal. The image signal subjected to the CDS is output from the horizontal control section 50 as an output image signal from the image pickup apparatus 1.

In this way, the photoelectric conversion section 110 can perform the analog-digital conversion on the image signal. The photoelectric conversion sections 120 to 140 similarly perform the analog-to-digital conversion on the image signal. This behavior will be described with reference to FIG. 11.

Figure 11:
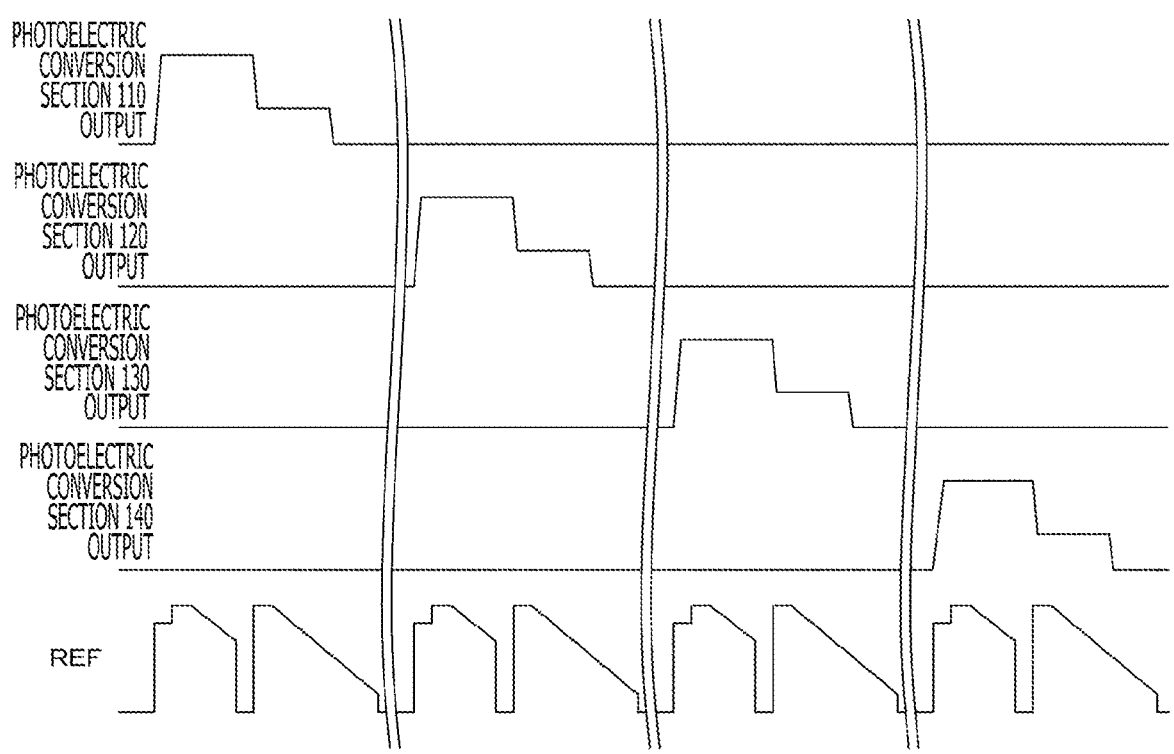
FIG. 11 illustrates an example of the analog-to-digital conversion process according to the first embodiment of the present technique.

FIG. 11 illustrates an example of the analog-to-digital conversion process according to the first embodiment of the present technique. FIG. 11 represents a relationship between the output signals from the photoelectric conversion sections 110 to 140 and the reference signal. As obvious from FIG. 11, after the photoelectric conversion section 110 ends the analog-to-digital conversion on the image signal, the photoelectric conversion sections 120 to 140 sequentially execute the analog-to-digital conversion on the image signal. At this time of the analog-to-digital conversion, a similar signal is input to the comparison section 150 as the reference signal. In addition, when the analog-to-digital conversion is being performed, the voltages of the output signals from the photoelectric conversion sections that are not to be subjected to the analog-to-digital conversion are generally 0 V. This is because when the MOS transistors 401 to 404 that are the signal input transistor selection section set any of the signal input transistors 153 to 156 that are not subjected to the analog-to-digital conversion into an unselected state, the generated charge retention sections 113 are discharged to approximately 0 V.

As described so far, the analog-to-digital conversion section 190 according to the first embodiment of the present technique includes the comparison section 150 that has the plurality of signal input transistor 153 and the like and that selects one of the signal input transistor 153 and the like. It is thereby possible to select the output signal from among those from the plurality of photoelectric conversion sections, compare the selected output signal with the reference signal, and simplify the configuration of the pixel 100.

2. Second Embodiment

According to the first embodiment described above, the photoelectric conversion sections 110 and the like each having one charge generation section 111 are used. According to a second embodiment of the present technique, by contrast, the photoelectric conversion section 110 and the like each having a plurality of charge generation sections are used. This can simplify the configuration of the pixel 100.
[Configuration of Photoelectric Conversion Section]

Figure 12:
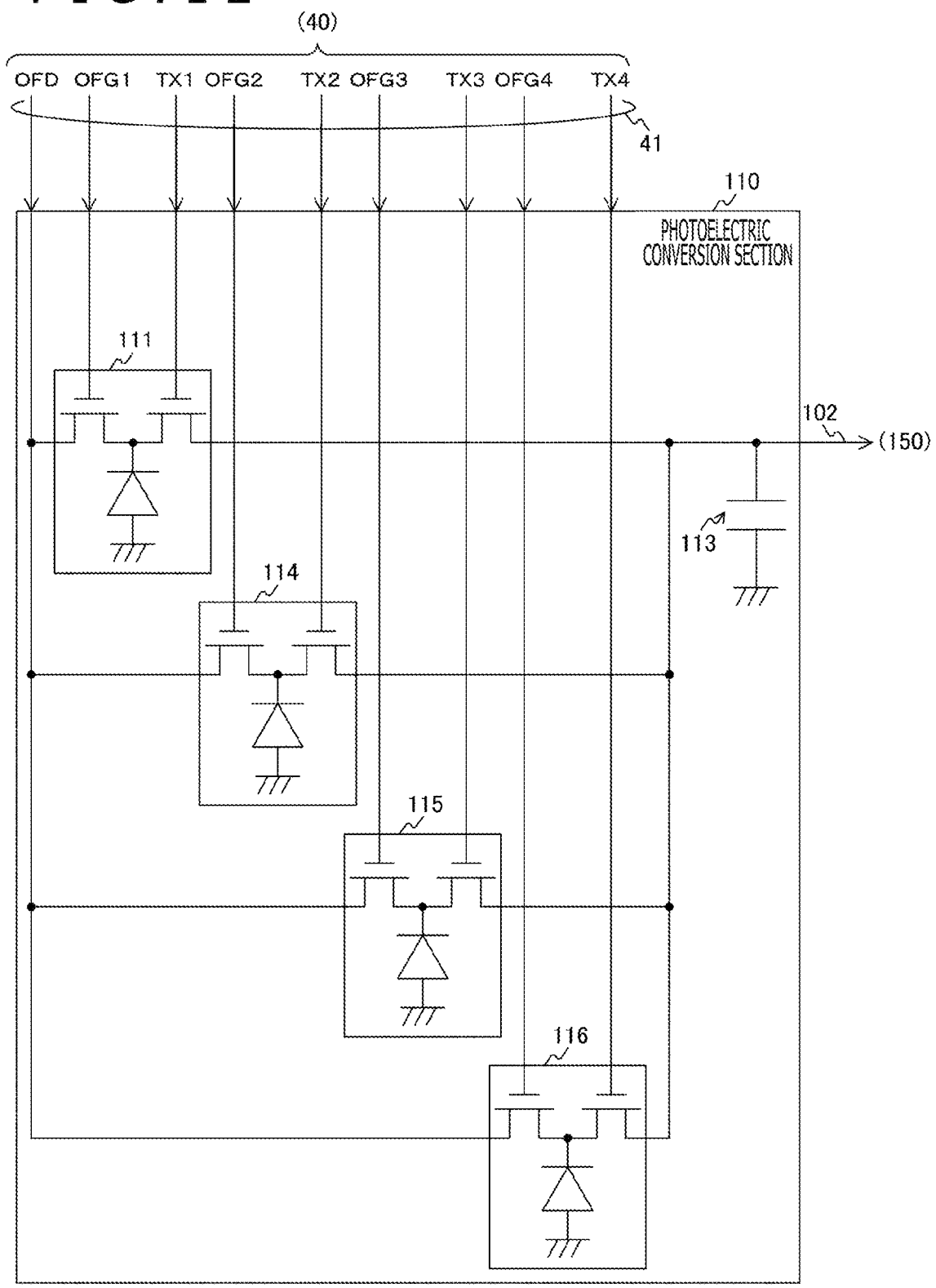
FIG. 12 illustrates an example of a configuration of a photoelectric conversion section 110 according to a second embodiment of the present technique.

FIG. 12 illustrates an example of a configuration of the photoelectric conversion section 110 according to the second embodiment of the present technique. The photoelectric conversion section 110 in FIG. 12 differs from the photoelectric conversion section 110 described with reference to FIG. 5 in that the photoelectric conversion section 110 in FIG. 12 further includes charge generation sections 114 to 116. These charge generation sections 114 to 116 are connected to the overflow drain signal line OFD and the signal line 102 similarly to the charge generation section 111. Furthermore, overflow gate signal lines OFG1 to OFG4 and transfer signal lines TX1 to TX4 are interconnected line to the individual charge generation sections 111 and the charge generation sections 114 to 116.

In this way, the photoelectric conversion section 110 in FIG. 12 is configured such that outputs of the four charge generation sections are commonly connected to one generated charge retention section 113. Owing to this, the pixel 100 can be made simple in configuration, compared with a pixel configured such that the generated charge retention section is provided for each of a plurality of charge generation sections. The charge generation section 111 and the like can transfer charge to the generated charge retention section 113 by sequentially inputting ON signals to the transfer signal lines TX1 to TX4.

Since the configuration of the image pickup apparatus 1 is similar to that of the image pickup apparatus 1 in the first embodiment of the present technique in other respects, description of the configuration in the other respects will be omitted.

In this way, in the photoelectric conversion section 110 according to the second embodiment of the present technique, the generated charge retention section 113 is shared among the plurality of charge generation sections (the charge generation section 111 and the charge generation sections 114 to 116). This can simplify the configuration of the pixel 100.

3. Third Embodiment

According to the first embodiment described above, one reference input transistor 157 is used. According to a third embodiment of the present technique, by contrast, a plurality of reference input transistors are used. This can improve a performance of the comparison section 150.
[Configuration of Comparison Section]

Figure 13:
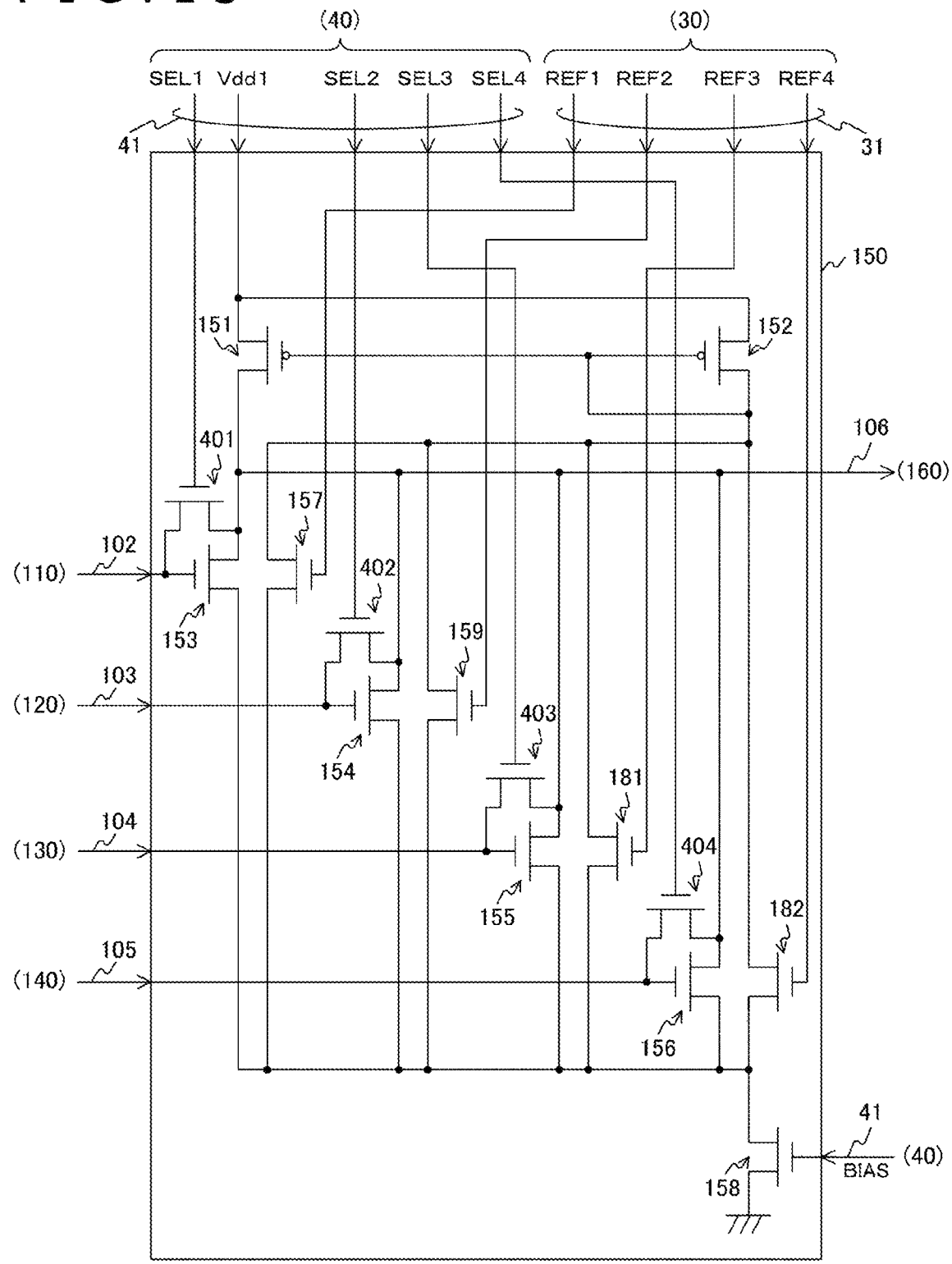
FIG. 13 illustrates an example of a configuration of a comparison section 150 according to a third embodiment of the present technique.

FIG. 13 illustrates an example of a configuration of the comparison section 150 according to the third embodiment of the present technique. The comparison section 150 in FIG. 13 differs from the comparison section 150 described with reference to FIG. 6 in that the comparison section 150 in FIG. 13 further includes reference input transistors 159, 181, and 182. N channel MOS transistors can be used as these reference input transistors. Drains of the reference input transistors 159, 181, and 182 are commonly connected to the drain of the reference input transistor 157. Sources of the reference input transistors 159, 181, and 182 are commonly connected to the source of the reference input transistor 157. Furthermore, reference signal lines REF1 to REF4 are connected to gates of the reference input transistors 157, 159, 181, and 182, respectively.

In this way, the reference input transistors 157, 159, 181, and 182 and the signal input transistors 153 to 156 configure differential pairs, respectively. Owing to this, these differential pairs can be arranged adjacently in a semiconductor chip. Since characteristics of the transistors configuring the differential pairs can be made uniform, it is possible to reduce a temperature drift and the like and improve the performance of the comparison section 150.
[Analog-to-Digital Conversion Process]

Figure 14:
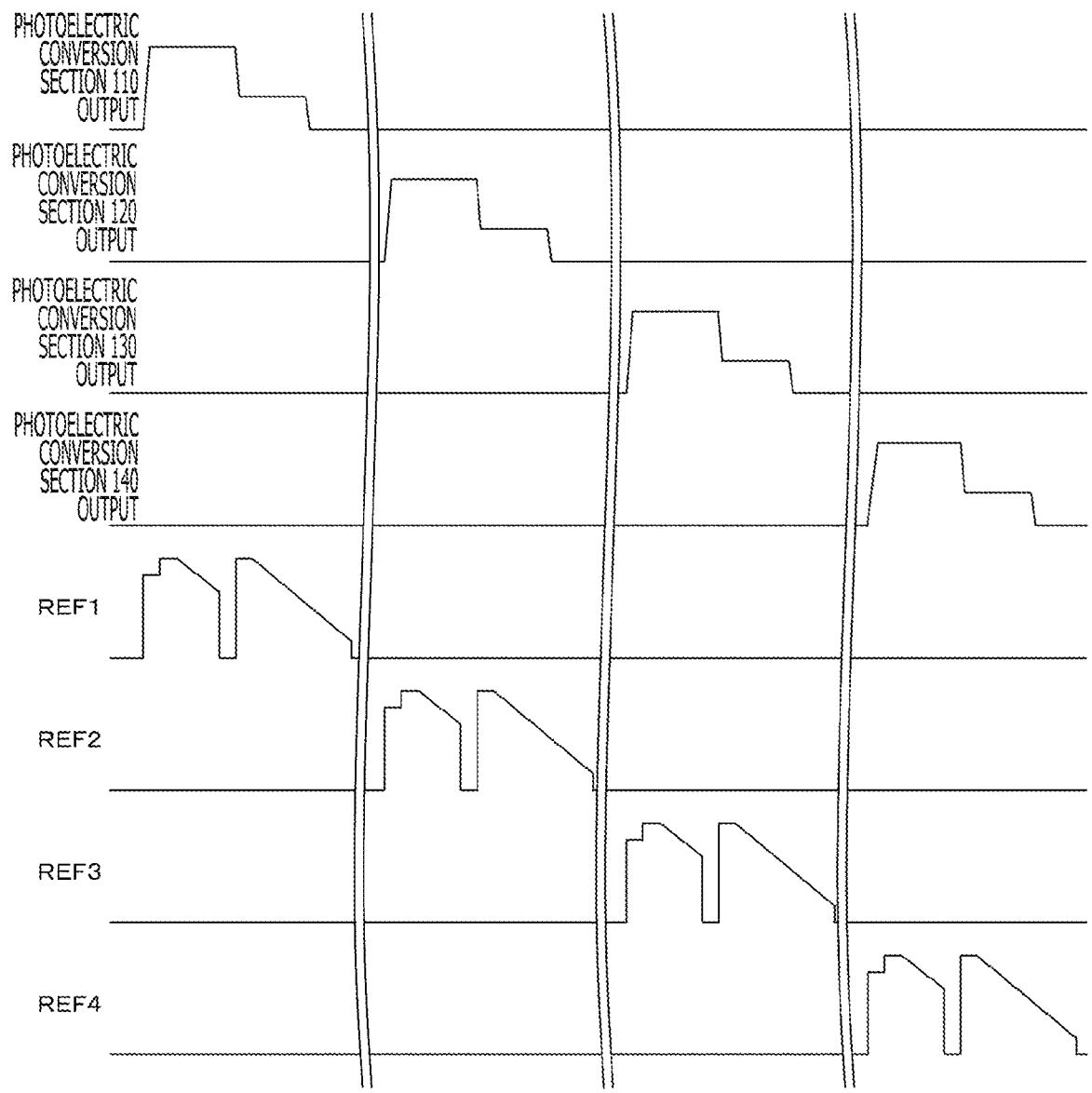
FIG. 14 illustrates an example of an analog-to-digital conversion process according to the second embodiment of the present technique.

FIG. 14 illustrates an example of an analog-to-digital conversion process according to the second embodiment of the present technique. FIG. 14 represents a relationship between the output signals from the photoelectric conversion sections 110 to 140 and reference signals, similarly to FIG. 11. According to the second embodiment of the present technique, the reference signals are sequentially input to the reference signal lines REF1 to REF4 when the photoelectric conversion sections 110 to 140 perform analog-digital conversion. In addition, it is necessary to set voltages of the reference signals input to the photoelectric conversion sections that are not to be subjected to the analog-to-digital conversion to generally 0 V. This is intended to turn the corresponding reference input transistors among the reference input transistors 157 and the like into a non-conductive state.

Since the configuration of the image pickup apparatus 1 is similar to that of the image pickup apparatus 1 in the first embodiment of the present technique in other respects, description of the configuration in the other respects will be omitted.

In this way, according to the third embodiment of the present technique, the reference input transistors are provided to correspond to the plurality of signal input transistors to configure the differential pairs. It is thereby possible to arrange the transistors configuring the differential pairs adjacently and improve the performance of the comparison section 150.

4. Fourth Embodiment

According to the third embodiment described above, the currents flowing in the plurality of differential pairs are controlled by one constant current power supply. According to a third embodiment of the present technique, by contrast, a constant current power supply is arranged for each of the plurality of differential pairs and controls each of the differential pairs. This can improve the performance of the comparison section 150.

[Configuration of Comparison Section]

Figure 15:
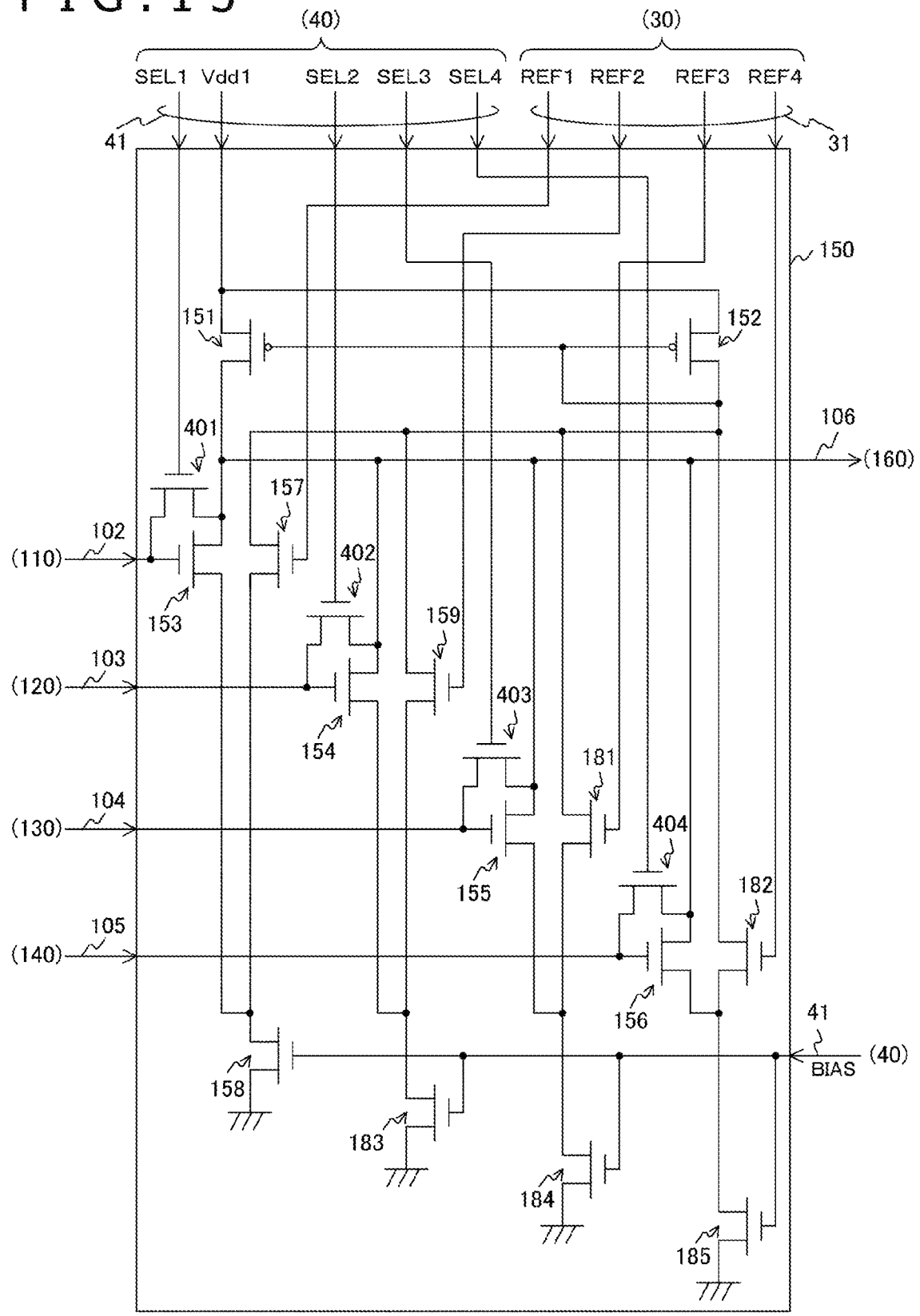
FIG. 15 illustrates an example of a configuration of a comparison section 150 according to a fourth embodiment of the present technique.

FIG. 15 illustrates an example of a configuration of the comparison section 150 according to the fourth embodiment of the present technique. The comparison section 150 in FIG. 15 differs from the comparison section 150 described with reference to FIG. 13 in that the comparison section 150 in FIG. 15 further includes MOS transistors 183 to 185. N channel MOS transistors can be used as these MOS transistors. The source of the signal input transistor 153 and the source of the reference input transistor 157 are commonly connected to the drain of the MOS transistor 158. The source of the signal input transistor 154 and a source of the reference input transistor 159 are commonly connected to a drain of the MOS transistor 183. The source of the signal input transistor 155 and a source of the reference input transistor 181 are commonly connected to a drain of the MOS transistor 184. The source of the signal input transistor 156 and a source of the reference input transistor 182 are commonly connected to a drain of the MOS transistor 185. Gates of the MOS transistors 158, 183, 184, and 185 are commonly connected to the bias signal line BIAS. Sources of the MOS transistors 158, 183, 184, and 185 are grounded.

The MOS transistors 158, 183, 184, and 185 operate as constant current power supplies. These MOS transistor 158 and 183 are connected to the respective differential pairs, that is, the MOS transistor 158 is connected to the signal input transistor 153 and the reference input transistor 157 that configure the differential pair, and the MOS transistor 158 is connected to the signal input transistor 154 and the reference input transistor 159 that configure the differential pair. Likewise, the MOS transistor 184 and 185 are connected to the differential pairs, that is, the MOS transistor 184 is connected to the signal input transistor 155 and the reference input transistor 181 that configure the differential pair, and the MOS transistor 185 is connected to the signal input transistor 156 and the reference input transistor 182 that configure the differential pair.

Since the configuration of the image pickup apparatus 1 is similar to that of the image pickup apparatus 1 in the third embodiment of the present technique in other respects, description of the configuration in the other respects will be omitted.

In this way, according to the fourth embodiment of the present technique, the signal input transistors and the reference input transistors that configure the differential pairs and the MOS transistors that configure the constant current power supplies can be arranged adjacently in a semiconductor chip. This can improve the performance of the comparison section 150.

5. Fifth Embodiment

According to the fourth embodiment described above, the constant current power supply is arranged for each of the plurality of differential pairs. According to a fifth embodiment of the present technique, by contrast, the plurality of constant current power supplies are used as a signal input transistor selection section by individually controlling the plurality of constant current power supplies. This can simplify the configuration of the comparison section 150.

[Configuration of Pixel]

FIG. 16 illustrates an example of the configuration of the pixel 100 according to the fifth embodiment of the present technique. The pixel 100 in FIG. 16 differs from the pixel 100 described with reference to FIG. 4 in that the signal line 106 that transmits the output signal from the comparison section 150 is further connected to the photoelectric conversion sections 110 to 140.

[Configuration of Photoelectric Conversion Section]

Figure 17:
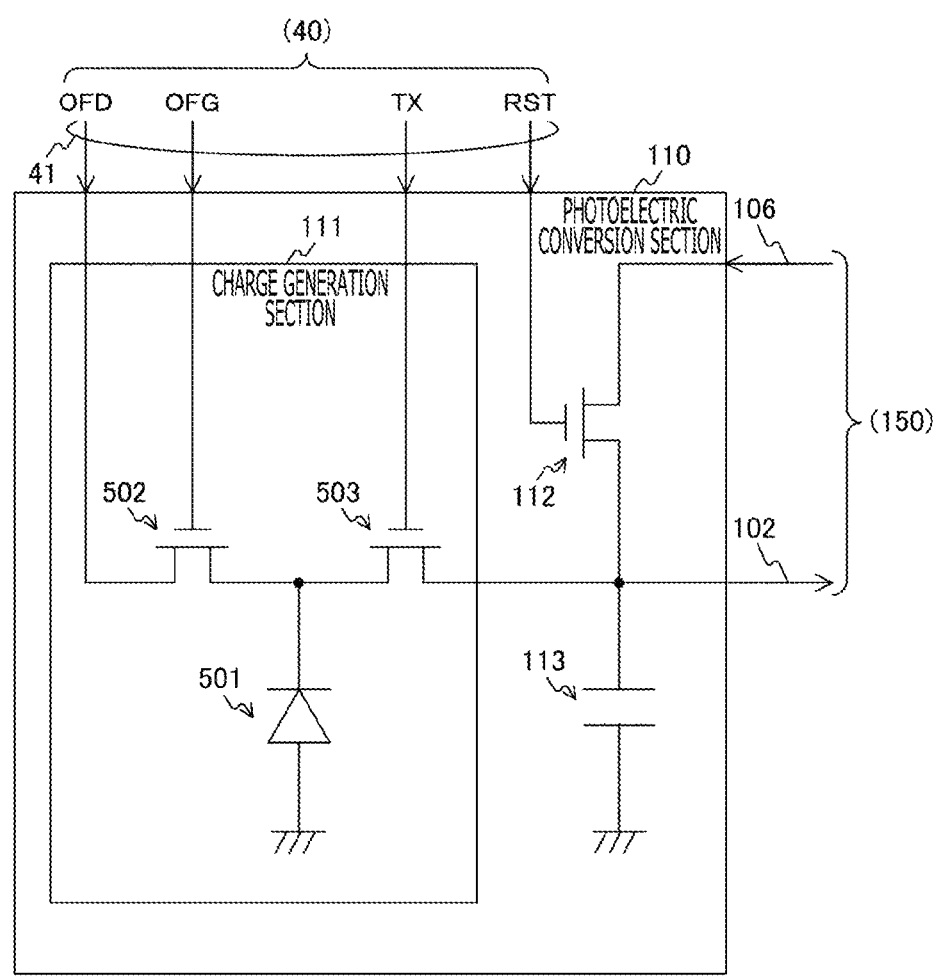
FIG. 17 illustrates an example of a configuration of a photoelectric conversion section 110 according to the fifth embodiment of the present technique.

FIG. 17 illustrates an example of a configuration of the photoelectric conversion section 110 according to the fifth embodiment of the present technique. The photoelectric conversion section 110 in FIG. 17 differs from the photoelectric conversion section 110 described with reference to FIG. 5 in that the photoelectric conversion section 110 in FIG. 17 further includes a MOS transistor 112. An N channel MOS transistor can be used as this MOS transistor 112. A drain and a source of the MOS transistor 112 are connected to the signal lines 106 and 102, respectively. A gate of the MOS transistor 112 is connected to a reset signal line RST (reset).

In the photoelectric conversion section 110 in FIG. 17, the MOS transistor 112 resets the generated charge retention section 113. In other words, when an ON signal is input to the reset signal line RST, then the MOS transistor 112 is turned into a conductive state, and a reset voltage is applied to the generated charge retention section 113 via the signal line 106 to reset the generated charge retention section 113.

[Configuration of Comparison Section]

Figure 18:
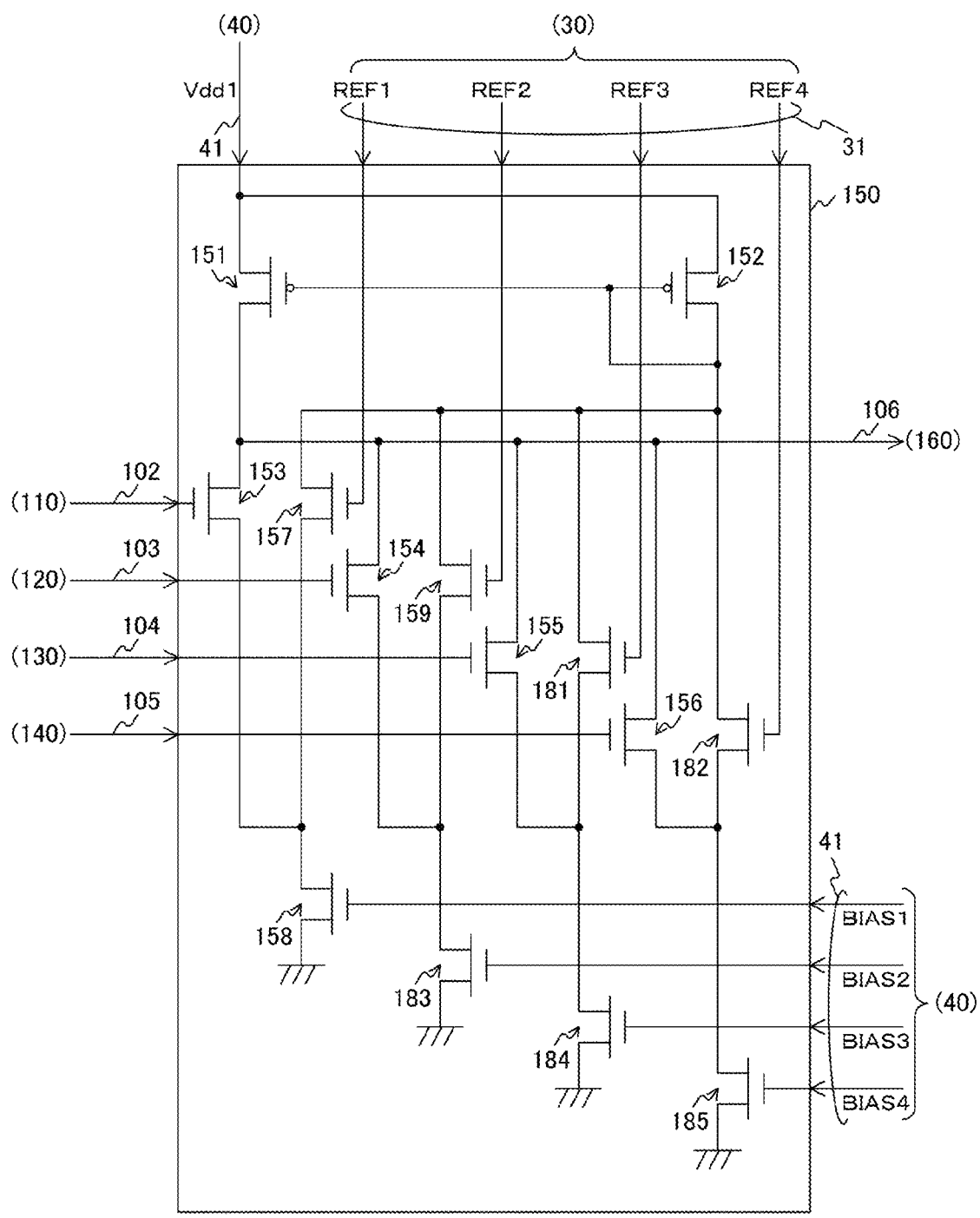
FIG. 18 illustrates an example of a configuration of a comparison section 150 according to the fifth embodiment of the present technique.

FIG. 18 illustrates an example of a configuration of the comparison section 150 according to the fifth embodiment of the present technique. The comparison section 150 in FIG. 18 does not need to include the MOS transistors 401 to 404. Furthermore, the comparison section 150 in FIG. 18 differs from the comparison section 150 described with reference to FIG. 15 in that bias signal lines BAS1 to BIAS4 are connected to the respective gates of the MOS transistors 158, 183, 184, and 185. It is noted that the MOS transistors 158, 183, 184, and 185 are an example of the signal input transistor selection section described in claims.

The MOS transistors 158, 183, 184, and 185 are constant current power supplies that control the respective currents flowing in the differential pairs to which the MOS transistors 158, 183, 184, and 185 are connected. Furthermore, the MOS transistors 158, 183, 184, and 185 operate as the signal input transistor selection section that selects any one of the signal input transistors 153 to 156. A selection method will be described while taking a case of selecting the signal input transistor 153 by way of example. A predetermined voltage is applied to the bias signal line BIAS1 connected to the gate of the MOS transistor 158 connected to the signal input transistor 153. In addition, voltages of the bias signal lines BIAS2 to BIAS4 are set to approximately 0 V. This turns the MOS transistors 183 to 185 connected to the bias signal lines BIAS2 to BIAS4 into a non-conductive state, and the currents flowing in the signal input transistors 154 to 156 are interrupted. The signal input transistor 153 can be thereby selected.

In this way, providing the MOS transistors 158, 183, 184, and 185 that are the constant current power supplies with a function to select one of the signal input transistors in the comparison section 150 in FIG. 18 makes it possible to simplify the configuration of the comparison section 150. Furthermore, the signal input transistors and the reference input transistors that configure the differential pairs and the MOS transistors that configure the constant current power supplies can be arranged adjacently.

Since the configuration of the image pickup apparatus 1 is similar to that of the image pickup apparatus 1 in the fourth embodiment of the present technique in other respects, description of the configuration in the other respects will be omitted.

In this way, according to the fifth embodiment of the present technique, it is possible to provide the MOS transistors 158, 183, 184, and 185 that are the constant current power supplies with the function to select one of the signal input transistors, and simplify the configuration of the comparison section 150.

6. Sixth Embodiment

According to the first embodiment described above, the voltage of the reference signal line REF is set to 0 V at the time of selecting one of the signal input transistors 153 to 156. Subsequently, the MOS transistors 401 to 404 are turned into a conductive state. According to a sixth embodiment of the present technique, by contrast, currents flowing in unselected signal input transistors among the signal input transistors 153 to 156 are interrupted. This can simplify a process performed by the comparison section 150.
[Configuration of Comparison Section]

Figure 19:
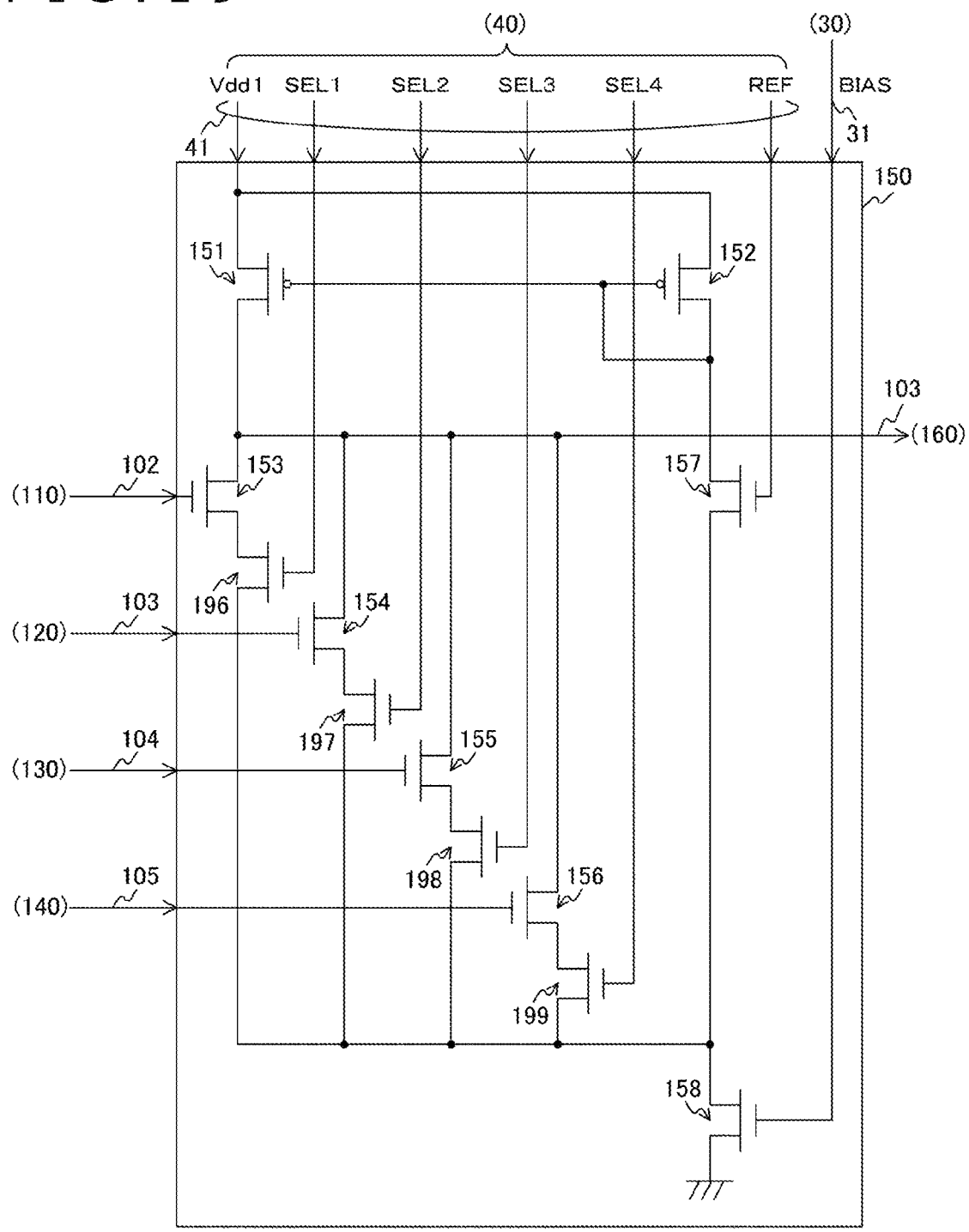
FIG. 19 illustrates an example of a configuration of a comparison section 150 according to a sixth embodiment of the present technique.

FIG. 19 illustrates an example of a configuration of the comparison section 150 according to the sixth embodiment of the present technique. The comparison section 150 in FIG. 18 does not need to include the MOS transistors 401 to 404. Furthermore, the comparison section 150 in FIG. 19 differs from the comparison section 150 described with reference to FIG. 6 in that the comparison section 150 in FIG. 19 further includes MOS transistors 196 to 199. It is noted that the MOS transistors 196 to 199 are an example of the signal input transistor selection section described in claims.

The source of the signal input transistor 153 is connected to a drain of the MOS transistor 196. The source of the signal input transistor 154 is connected to a drain of the MOS transistor 197. The source of the signal input transistor 155 is connected to a drain of the MOS transistor 198. The source of the signal input transistor 156 is connected to a drain of the MOS transistor 199. Gates of the MOS transistors 196 to 199 are connected to the selection signal lines SEL1 to SEL4, respectively. Sources of the MOS transistors 196 to 199 are commonly connected to the source of the reference input transistor 157 and the drain of the MOS transistor 158.

In this way, the MOS transistors 196 to 199 are connected in series to the signal input transistors 153 to 156, respectively. When one of the signal input transistors is selected, selection can be performed by turning one of the MOS transistors 196 to 199 connected to the signal input transistor to be selected into a conductive state and turning the other MOS transistors among the MOS transistors 196 to 199 into a non-conductive state. For example, in a case of selecting the signal input transistor 153, the selection can be performed by inputting an ON signal to the selection signal line SEL1. In this way, the comparison section 150 in FIG. 19 does not need to set the voltage of the reference signal line REF to 0 V at the time of performing the selection and a selection process can be simplified, differently from the comparison section 150 described with reference to FIG. 6.

Since the configuration of the image pickup apparatus 1 is similar to that of the image pickup apparatus 1 in the first embodiment of the present technique in other respects, description of the configuration in the other respects will be omitted.

In this way, according to the sixth embodiment of the present technique, using the MOS transistors 196 to 199 connected in series to the signal input transistors 153 to 156 as the signal input transistor selection section makes it possible to simplify the selection process.

7. Seventh Embodiment

According to the first embodiment described above, the time code is continuously rewritten in the storage sections 172 to 179 of the conversion result retention section 170 while the voltage of the output signal from the photoelectric conversion section 110 or the like is lower than the voltage of the reference signal. According to a seventh embodiment of the present technique, by contrast, rewriting of the time code is limited. This can achieve saving of power consumption in the analog-to-digital conversion section 190.
[Configuration of Comparison Output Processing Section]

Figure 20:
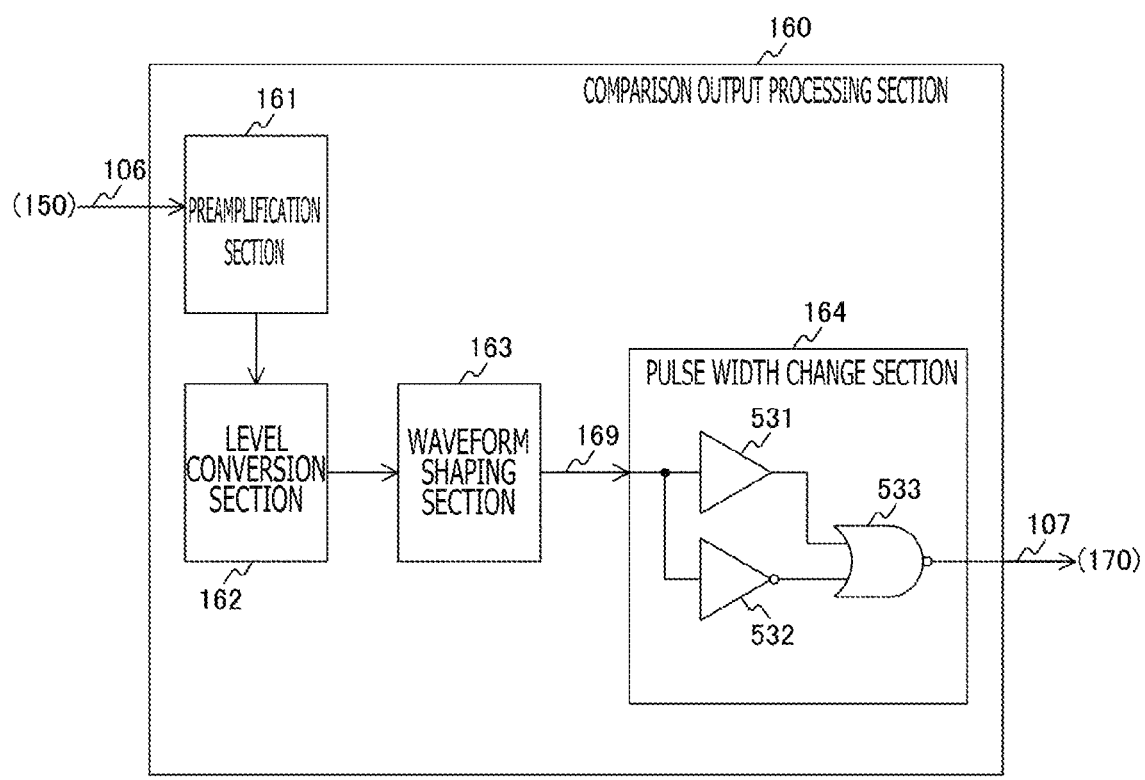
FIG. 20 illustrates an example of a configuration of a comparison output processing section 160 according to a seventh embodiment of the present technique.

FIG. 20 illustrates an example of a configuration of the comparison output processing section 160 according to the seventh embodiment of the present technique. This comparison output processing section 160 differs from the comparison output processing section 160 described with reference to FIG. 7 in that the comparison output processing section 160 in FIG. 20 further includes a pulse width change section 164.

The pulse width change section 164 changes a pulse width of the signal output from the waveform shaping section 163 via a signal line 169. This pulse width change is performed by shortening a period in which the output signal from the waveform shaping section 163 is in a state of taking on value "1." Specifically, the pulse width change section 164 generates and outputs a signal that takes on value "1" only in a predetermined period while a value of the output signal from the waveform shaping section 163 transitions from "1" to "0." As this predetermined period, a period equal to time necessary to retain the time code input to the storage sections 172 to 179 described with reference to FIG. 8 can be adopted. It is thereby possible to reduce the number of times of writing the time code in the storage sections 172 to 179 described with reference to FIGS. 8 and 10.

The pulse width change section 164 in FIG. 20 includes a non-inverting gate 531, an inverting gate 532, and a NOR gate 533. The inverting gate 532 is configured herein such that a signal propagation delay is longer than that of the non-inverting gate 531. Outputs from the non-inverting gate 531 and the inverting gate 532 are input to the NOR gate 533 and subjected to logical NOR; thus, it is possible to generate a signal at a pulse width corresponding to a difference in propagation delay time between the non-inverting gate 531 and the inverting gate 532.

[Configuration of Pulse Width Change Section]

FIG. 21 illustrates examples of a configuration of the pulse width change section 164 according to the seventh embodiment of the present technique. The pulse width change section 164 in a of FIG. 21 uses a circuit configured with a non-inverting gate 534, an inverting gate 535, and a capacitor 536 as an alternative to the inverting gate 532 described with reference to FIG. 20. The propagation delay time can be set by an action of the capacitor 536. The pulse width change section 164 in b of FIG. 21 uses a circuit configured with inverting gates 537, 538, and 535 connected in series as an alternative to the inverting gate 532. The propagation delay time is set by the three inverting gates.

Since the configuration of the image pickup apparatus 1 is similar to that of the image pickup apparatus 1 in the first embodiment of the present technique in other respects, description of the configuration in the other respects will be omitted.

In this way, according to the seventh embodiment of the present technique, changing the pulse width of the signal output from the waveform shaping section 163 makes it possible to reduce the number of times of rewriting the time code in the storage sections 172 to 179. This can achieve the saving of power consumption in the analog-to-digital conversion section 190.

[Modification]

While the non-inverting gate 531 is used according to the seventh embodiment of the present technique described above, the comparison output processing section 160 can be used. This can simplify the configuration of the pulse width change section 164.

[Configuration of Comparison Output Processing Section]

Figure 22:
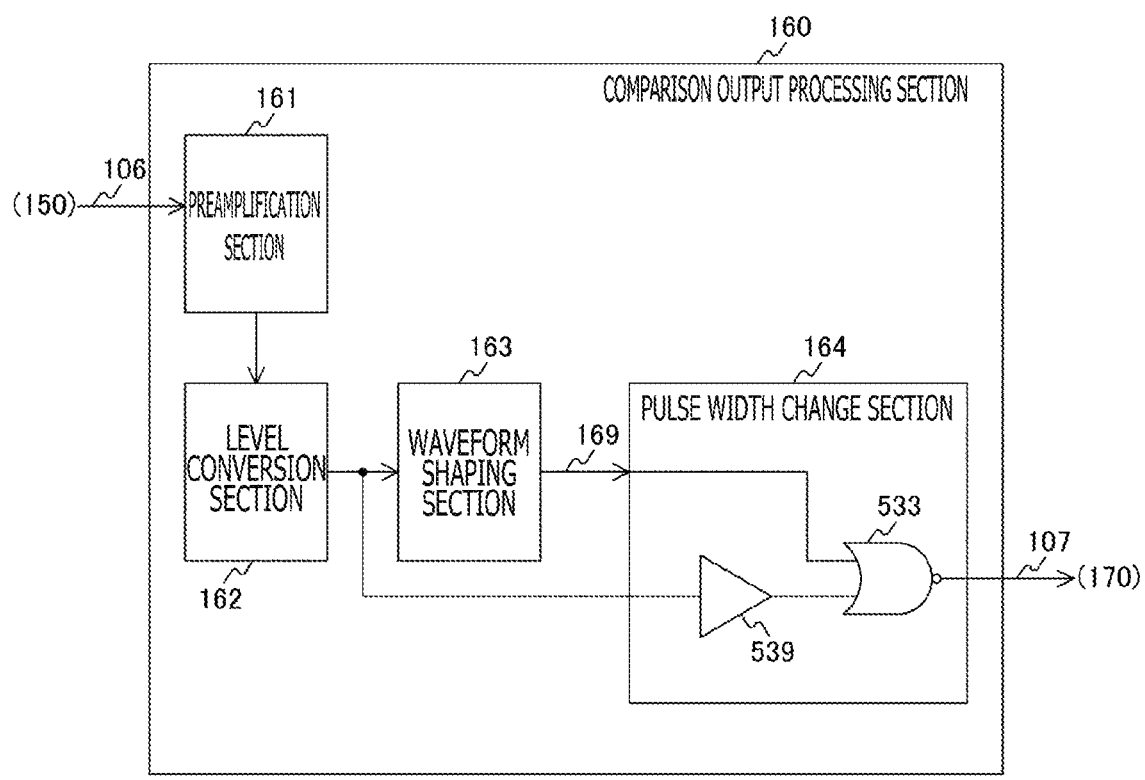
FIG. 22 illustrates an example of a configuration of a comparison output processing section 160 according to a modification of the seventh embodiment of the present technique.

FIG. 22 illustrates an example of a configuration of the comparison output processing section 160 according to a modification of the seventh embodiment of the present technique. The comparison output processing section 160 in FIG. 22 does not need to include the non-inverting gate 531 of the pulse width change section 164 described with reference to FIG. 20. Furthermore, the pulse width change section 164 includes a non-inverting gate 539 as an alternative to the inverting gate 532. This non-inverting gate 539 is a gate having long propagation delay time similarly to the inverting gate 532. The output signal from the level conversion section 162 is input to this non-inverting gate 539. Output signals from the waveform shaping section 163 and the non-inverting gate 539 are input to the NOR gate 533.

It is noted that the configuration of the pulse width change section 164 is not limited to this example. For example, the pulse width change section 164 can be configured such that the non-inverting gate 539 is eliminated and the output signal from the level conversion section 162 is directly input to the NOR gate 533.

It is noted that the embodiments each illustrate an example for embodying the present technique, and that a correspondence relationship is held between each of the matters in the embodiments and each of invention specifying matters in claims. Likewise, a correspondence relationship is held between each of the invention specifying matters in claims and each of matters denoted by the same name in the embodiments of the present technique. However, the present technique is not limited to the embodiments and can be embodied by making various modifications of the embodiments without departing from the spirit of the technique.

Moreover, processing procedures described in the above embodiments may be regarded as a method involving these series of procedures, may be regarded as a program for causing a computer to execute these series of procedures or as a recording medium that stores the program. Examples of this recording medium that can be used include a CD (Compact Disc), an MD (MiniDisc), a DVD (Digital Versatile Disc), a memory card, a Blu-ray (registered trademark) Disc.

Furthermore, the effects described in the present specification are given as an example only, and the effects are not limited to those described in the present specification and may contain other effects.

It is noted that the present technique can be configured as follows.

(1) A comparator including:

a plurality of signal input transistors each having a control terminal to which an input signal is input;

a reference input transistor configuring, together with each of the plurality of signal input transistors, a differential pair, and having a control terminal to which a reference signal is input;

a signal input transistor selection section selecting any one of the plurality of signal input transistors, and generating a current in response to a difference between the input signal and the reference signal to flow in the differential pair configured with the selected signal input transistor and the reference input transistor; and a load section converting, at a time of a change of a current flowing in any one of the plurality of signal input transistors and the reference input transistor in response to the difference, the change of the current into a change of a voltage, and outputting the change of the voltage as a result of comparison between the input signal and the reference signal.

(2) The comparator according to (1), in which the signal input transistor selection section selects the one signal input transistor by applying, to the control terminals of unselected signal input transistors among the plurality of signal input transistors, a voltage for turning the unselected signal input transistors into a non-conductive state.

(3) The comparator according to (1), in which the signal input transistor selection section selects the one signal input transistor by interrupting a current flowing in unselected signal input transistors among the plurality of signal input transistors.

(4) The comparator according to any one of (1) to (3), in which the load section is configured with a current source that supplies a current to the plurality of signal input transistors.

(5) The comparator according to (4), in which the load section is configured with a current mirror circuit that supplies, to the plurality of signal input transistors, a current substantially equal to a current flowing in the reference input transistor.

(6) A comparator including:

a plurality of signal input transistors each having a control terminal to which an input signal is input;

a plurality of reference input transistors configuring, together with the respective plurality of signal input transistors, differential pairs, and each having a control terminal to which a reference signal is input;

a signal input transistor selection section selecting any one of the plurality of signal input transistors, and generating a current in response to a difference between the input signal and the reference signal to flow in the differential pair configured with the selected signal input transistor and one of the plurality of reference input transistors; and a load section converting, at a time of a change of a current flowing in any one of the plurality of signal input transistors and the plurality of reference input transistors in response to the difference, the change of the current into a change of a voltage, and outputting the change of the voltage as a result of comparison between the input signal and the reference signal.

(7) The comparator according to (6), in which
the signal input transistor selection section selects the one signal input transistor by interrupting a current flowing in the differential pairs including unselected signal input transistors among the plurality of differential pairs.

(8) The comparator according to (7), in which
the signal input transistor selection section is configured with a plurality of constant current power supplies that are connected to the respective plurality of differential pairs and that control a current flowing in the differential pairs, the signal input transistor selection section interrupting the current flowing in the differential pairs including the unselected signal input transistors by the constant current power supplies.

(9) An analog-to-digital converter including:
a plurality of signal input transistors each having a control terminal to which an input signal is input;
a reference input transistor configuring, together with each of the plurality of signal input transistors, a differential pair, and having a control terminal to which a reference signal is input;
a signal input transistor selection section selecting any one of the plurality of signal input transistors, and generating a current in response to a difference between the input signal and the reference signal to flow in the differential pair configured with the selected signal input transistor and the reference input transistor;
a load section converting, at a time of a change of a current flowing in any one of the plurality of signal input transistors and the reference input transistor in response to the difference, the change of the current into a change of a voltage, and outputting the change of the voltage as a result of comparison between the input signal and the reference signal; and
a retention section retaining a digital signal in response to the reference signal on the basis of the output result of the comparison, and outputting the retained digital signal as a result of analog-to-digital conversion performed on the input signal.

(10) A solid-state image pickup device including:
a plurality of photoelectric conversion sections each generating a signal in response to incident light;
a plurality of signal input transistors each having a control terminal to which the generated signal is input;
a reference input transistor configuring, together with each of the plurality of signal input transistors, a differential pair, and having a control terminal to which a reference signal is input;
a signal input transistor selection section selecting any one of the plurality of signal input transistors, and generating a current in response to a difference between the input signal and the reference signal to flow in the differential pair configured with the selected signal input transistor and the reference input transistor;
a load section converting, at a time of a change of a current flowing in any one of the plurality of signal input transistors and the reference input transistor in response to the difference, the change of the current into a change of a voltage, and outputting the change of the voltage as a result of comparison between the input signal and the reference signal; and
a retention section retaining a digital signal in response to the reference signal on the basis of the output result of the comparison, and outputting the retained digital signal as a result of analog-to-digital conversion performed on the generated signal.

(11) An image pickup apparatus including:
a plurality of photoelectric conversion sections each generating a signal in response to incident light;
a plurality of signal input transistors each having a control terminal to which the generated signal is input;
a reference input transistor configuring, together with each of the plurality of signal input transistors, a differential pair, and having a control terminal to which a reference signal is input;
a signal input transistor selection section selecting any one of the plurality of signal input transistors, and generating a current in response to a difference between the input signal and the reference signal to flow in the differential pair configured with the selected signal input transistor and the reference input transistor;
a load section converting, at a time of a change of a current flowing in any one of the plurality of signal input transistors and the reference input transistor in response to the difference, the change of the current into a change of a voltage, and outputting the change of the voltage as a result of comparison between the generated signal and the reference signal;
a retention section retaining a digital signal in response to the reference signal on the basis of the output result of the comparison, and outputting the retained digital signal as a result of analog-to-digital conversion performed on the generated signal; and
a processing circuit processing the output digital signal.

REFERENCE SIGNS LIST

10: Pixel array section
20: Time code generation section
30: Reference signal generation section
40: Vertical drive section
42: Control signal generation section
43: Power supply section
50: Horizontal control section
52: Time code decoding section
53: Column signal processing section
54: Clock signal generation section
100: Pixel
110, 120, 130, 140: Photoelectric conversion section
111: Charge generation section
113: Generated charge retention section
150: Comparison section
112, 151, 152, 158, 183 to 185, 196 to 199, 401 to 404, 502, 503, 511 to 517: MOS transistor
153 to 156: Signal input transistor
157, 159, 181, 182: Reference input transistor
160: Comparison output processing section
161: Preamplification section
162: Level conversion section
163: Waveform shaping section
164: Pulse width change section
170: Conversion result retention section
171: Storage control section 172: Storage section
190: Analog-to-digital conversion section
200: Time code transfer section
210, 230: Code retention section
211: Flip-flop
220, 240: Clock buffer
221 to 224, 532, 535, 537, 538: Inverting gate
501: Photodiode
521: OR gate
522: Bit storage section
523: Bidirectional switch
531, 534, 539: Non-inverting gate
533 NOR gate
536: Capacitor

The invention claimed is:

1. A comparator, comprising:
a plurality of signal input transistors each having a control terminal to which an input signal is input;
a reference input transistor configuring, together with each of the plurality of signal input transistors, a differential pair, and having a control terminal to which a reference signal is input;
a signal input transistor selection section selecting any one of the plurality of signal input transistors, and generating a current in response to a difference between the input signal and the reference signal to flow in the differential pair configured with the selected signal input transistor and the reference input transistor; and
a load section converting, at a time of a change of a current flowing in any one of the plurality of signal input transistors and the reference input transistor in response to the difference, the change of the current into a change of a voltage, and outputting the change of the voltage as a result of comparison between the input signal and the reference signal,
wherein the signal input transistor selection section selects the one signal input transistor by applying, to the control terminals of unselected signal input transistors among the plurality of signal input transistors, a voltage for turning the unselected signal input transistors into a non-conductive state.

2. The comparator according to claim 1, wherein the signal input transistor selection section selects the one signal input transistor by interrupting a current flowing in the unselected signal input transistors among the plurality of signal input transistors.

3. The comparator according to claim 1, wherein the load section is configured with a current source that supplies a current to the plurality of signal input transistors.

4. The comparator according to claim 3, wherein the load section is configured with a current mirror circuit that supplies, to the plurality of signal input transistors, a current substantially equal to a current flowing in the reference input transistor.

5. A comparator, comprising:
a plurality of signal input transistors each having a control terminal to which an input signal is input;
a plurality of reference input transistors configuring, together with the respective plurality of signal input transistors, differential pairs, and each having a control terminal to which a reference signal is input;
a signal input transistor selection section selecting any one of the plurality of signal input transistors, and generating a current in response to a difference between the input signal and the reference signal to flow in the differential pair configured with the selected signal input transistor and one of the plurality of reference input transistors; and
a load section converting, at a time of a change of a current flowing in any one of the plurality of signal input transistors and the plurality of reference input transistors in response to the difference, the change of the current into a change of a voltage, and outputting the change of the voltage as a result of comparison between the input signal and the reference signal,
wherein the signal input transistor selection section selects the one signal input transistor by interrupting a current flowing in the differential pairs including unselected signal input transistors among the differential pairs, and
wherein the signal input transistor selection section is configured with a plurality of constant current power supplies that are connected to the respective differential pairs and that control a current flowing in the differential pairs, the signal input transistor selection section interrupting the current flowing in the differential pairs including the unselected signal input transistors by using the constant current power supplies.

6. An analog-to-digital converter comprising:
a plurality of signal input transistors each having a control terminal to which an input signal is input;
a reference input transistor configuring, together with each of the plurality of signal input transistors, a differential pair, and having a control terminal to which a reference signal is input;
a signal input transistor selection section selecting any one of the plurality of signal input transistors, and generating a current in response to a difference between the input signal and the reference signal to flow in the differential pair configured with the selected signal input transistor and the reference input transistor;
a load section converting, at a time of a change of a current flowing in any one of the plurality of signal input transistors and the reference input transistor in response to the difference, the change of the current into a change of a voltage, and outputting the change of the voltage as a result of comparison between the input signal and the reference signal; and
a retention section retaining a digital signal in response to the reference signal on the basis of the output result of the comparison, and outputting the retained digital signal as a result of analog-to-digital conversion performed on the input signal.

7. A solid-state image pickup device comprising:
a plurality of photoelectric conversion sections each generating a signal in response to incident light;
a plurality of signal input transistors each having a control terminal to which a respective generated signal is input;
a reference input transistor configuring, together with each of the plurality of signal input transistors, a differential pair, and having a control terminal to which a reference signal is input;
a signal input transistor selection section selecting any one of the plurality of signal input transistors, and generating a current in response to a difference between the input signal and the reference signal to flow in the differential pair configured with the selected signal input transistor and the reference input transistor;
a load section converting, at a time of a change of a current flowing in any one of the plurality of signal input transistors and the reference input transistor in response to the difference, the change of the current into a change of a voltage, and outputting the change of the voltage as a result of comparison between the input signal and the reference signal; and a retention section retaining a digital signal in response to the reference signal on the basis of the output result of the comparison, and outputting the retained digital signal as a result of analog-to-digital conversion performed on the generated signal.

8. An image pickup apparatus comprising:

a plurality of photoelectric conversion sections each generating a signal in response to incident light;

a plurality of signal input transistors each having a control terminal to which a respective generated signal is input;

a reference input transistor configuring, together with each of the plurality of signal input transistors, a differential pair, and having a control terminal to which a reference signal is input;

a signal input transistor selection section selecting any one of the plurality of signal input transistors, and generating a current in response to a difference between the input signal and the reference signal to flow in the differential pair configured with the selected signal input transistor and the reference input transistor;

a load section converting, at a time of a change of a current flowing in any one of the plurality of signal input transistors and the reference input transistor in response to the difference, the change of the current into a change of a voltage, and outputting the change of the voltage as a result of comparison between the generated signal and the reference signal;

a retention section retaining a digital signal in response to the reference signal on the basis of the output result of the comparison, and outputting the retained digital signal as a result of analog-to-digital conversion performed on the generated signal; and a processing circuit processing the output digital signal.

* * * * *